United States Patent
Yeh et al.

(10) Patent No.: US 12,368,080 B2
(45) Date of Patent: Jul. 22, 2025

(54) CHIP PACKAGE STRUCTURE WITH RING STRUCTURE

(71) Applicant: Taiwan Semiconductor Manufacturing Company, Ltd., Hsinchu (TW)

(72) Inventors: Shu-Shen Yeh, Taoyuan (TW); Po-Yao Lin, Zhudong Township, Hsinchu County (TW); Shin-Puu Jeng, Hsinchu (TW); Po-Chen Lai, Hsinchu County (TW); Kuang-Chun Lee, New Taipei (TW); Che-Chia Yang, Taipei (TW); Chin-Hua Wang, New Taipei (TW); Yi Hang Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 527 days.

(21) Appl. No.: 17/818,432

(22) Filed: Aug. 9, 2022

(65) Prior Publication Data
US 2022/0384391 A1 Dec. 1, 2022

Related U.S. Application Data

(62) Division of application No. 16/941,847, filed on Jul. 29, 2020, now Pat. No. 11,728,233.
(Continued)

(51) Int. Cl.
*H01L 23/24* (2006.01)
*H01L 23/00* (2006.01)
(Continued)

(52) U.S. Cl.
CPC .......... *H01L 23/24* (2013.01); *H01L 23/3128* (2013.01); *H01L 23/49816* (2013.01);
(Continued)

(58) Field of Classification Search
CPC ............... H01L 21/563; H01L 2224/17; H01L 2224/73204; H01L 2224/97; H01L 23/16;
(Continued)

(56) References Cited

U.S. PATENT DOCUMENTS

| 8,993,380 | B2 | 3/2015 | Hou et al. |
| 9,281,254 | B2 | 3/2016 | Yu et al. |

(Continued)

FOREIGN PATENT DOCUMENTS

| CN | 209118228 U | 7/2019 |
| CN | 209418492 U | 9/2019 |

(Continued)

OTHER PUBLICATIONS

Non-Final Office Action dated Dec. 16, 2022, issued in U.S. Appl. No. 16/941,847.
(Continued)

*Primary Examiner* — Jaehwan Oh
(74) *Attorney, Agent, or Firm* — McClure, Qualey & Rodack, LLP

(57) ABSTRACT

A chip package structure is provided. The chip package structure includes a wiring substrate. The chip package structure includes a first chip structure and a second chip structure over the wiring substrate. The first chip structure is spaced apart from the second chip structure by a gap. The chip package structure includes a ring structure over the wiring substrate. The ring structure has a first opening, the first chip structure and the second chip structure are in the first opening, the first opening has a first inner wall, the first inner wall has a first recess, and the gap extends toward the first recess.

20 Claims, 31 Drawing Sheets

Related U.S. Application Data

(60) Provisional application No. 62/959,323, filed on Jan. 10, 2020.

(51) Int. Cl.
  *H01L 23/31* (2006.01)
  *H01L 23/498* (2006.01)
  *H01L 25/00* (2006.01)
  *H01L 25/065* (2023.01)
  *H01L 25/18* (2023.01)

(52) U.S. Cl.
  CPC ........ *H01L 23/49833* (2013.01); *H01L 24/16* (2013.01); *H01L 25/0655* (2013.01); *H01L 25/18* (2013.01); *H01L 25/50* (2013.01); *H01L 2224/16227* (2013.01); *H01L 2224/17181* (2013.01); *H01L 2224/73204* (2013.01); *H01L 2224/97* (2013.01); *H01L 2924/15311* (2013.01)

(58) Field of Classification Search
  CPC . H01L 23/5389; H01L 24/20; H01L 25/0655; H01L 2924/181; H01L 2924/15311; H01L 2924/18161
  See application file for complete search history.

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 10,991,638 B2 | 4/2021 | Kwon | |
| 11,075,138 B2 | 7/2021 | Kwon | |
| 2003/0042617 A1 | 3/2003 | Lee | |
| 2017/0358535 A1 | 12/2017 | Yoo et al. | |
| 2018/0315728 A1* | 11/2018 | Pei | H01L 21/565 |
| 2019/0348340 A1* | 11/2019 | Kwon | H01L 23/3675 |
| 2019/0348343 A1* | 11/2019 | Kwon | H01L 23/3737 |
| 2020/0350229 A1 | 11/2020 | Chang et al. | |
| 2021/0066206 A1 | 3/2021 | Oh et al. | |

FOREIGN PATENT DOCUMENTS

| | | |
|---|---|---|
| CN | 209544312 U | 10/2019 |
| CN | 110491869 A | 11/2019 |
| KR | 10-2017-0140849 A | 12/2017 |
| WO | 2019/066997 A1 | 4/2019 |

OTHER PUBLICATIONS

Korean language office action dated Sep. 22, 2022, issued in application No. KR 10-2020-0188612.

* cited by examiner

CHIP PACKAGE STRUCTURE WITH RING STRUCTURE

PRIORITY CLAIM AND CROSS-REFERENCE

This application is a Divisional of U.S. application Ser. No. 16/941,847, filed on Jul. 29, 2020, which claims the benefit of U.S. Provisional Application No. 62/959,323, filed on Jan. 10, 2020, and entitled "CHIP PACKAGE STRUCTURE WITH RING STRUCTURE", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating layers or dielectric layers, conductive layers, and semiconductor layers over a semiconductor substrate, and patterning the various material layers using photolithography processes and etching processes to form circuit components and elements thereon.

Many integrated circuits (IC) are typically manufactured on a semiconductor wafer. Technological advances in IC materials and design have produced generations of ICs. Each generation has smaller and more complex circuits than the previous generation. The dies of the wafer may be processed and packaged at the wafer level, and various technologies have been developed for wafer level packaging. Since the chip package structure may need to include multiple chips with multiple functions, it is a challenge to form a reliable chip package structure with multiple chips.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a top view of the chip package structure of FIG. 1A, in accordance with some embodiments.

FIG. 1B-1 is a top view of the chip package structure of FIG. 1B, in accordance with some embodiments.

FIG. 1C-1 is a top view of the chip package structure of FIG. 1C, in accordance with some embodiments.

FIG. 1D-1 is a top view of the chip package structure of FIG. 1D, in accordance with some embodiments.

FIG. 1D-2 is a perspective view of the chip package structure of FIG. 1D, in accordance with some embodiments.

FIG. 1D-3 is a top view of the ring structure of the chip package structure of FIG. 1D, in accordance with some embodiments.

FIG. 1E-1 is a top view of the chip package structure of FIG. 1E, in accordance with some embodiments.

FIG. 1E-2 is a perspective view of the chip package structure of FIG. 1E, in accordance with some embodiments.

DETAILED DESCRIPTION

Figure 1A:
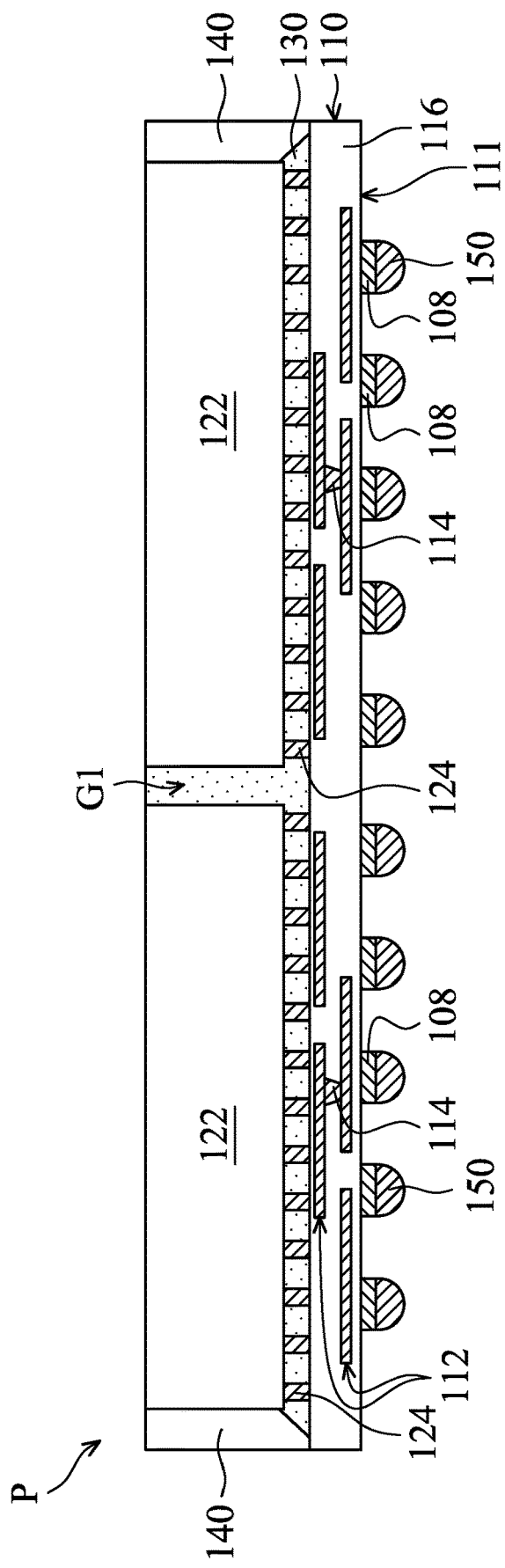
FIGS. 1A-1E are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figures 1, 1A:
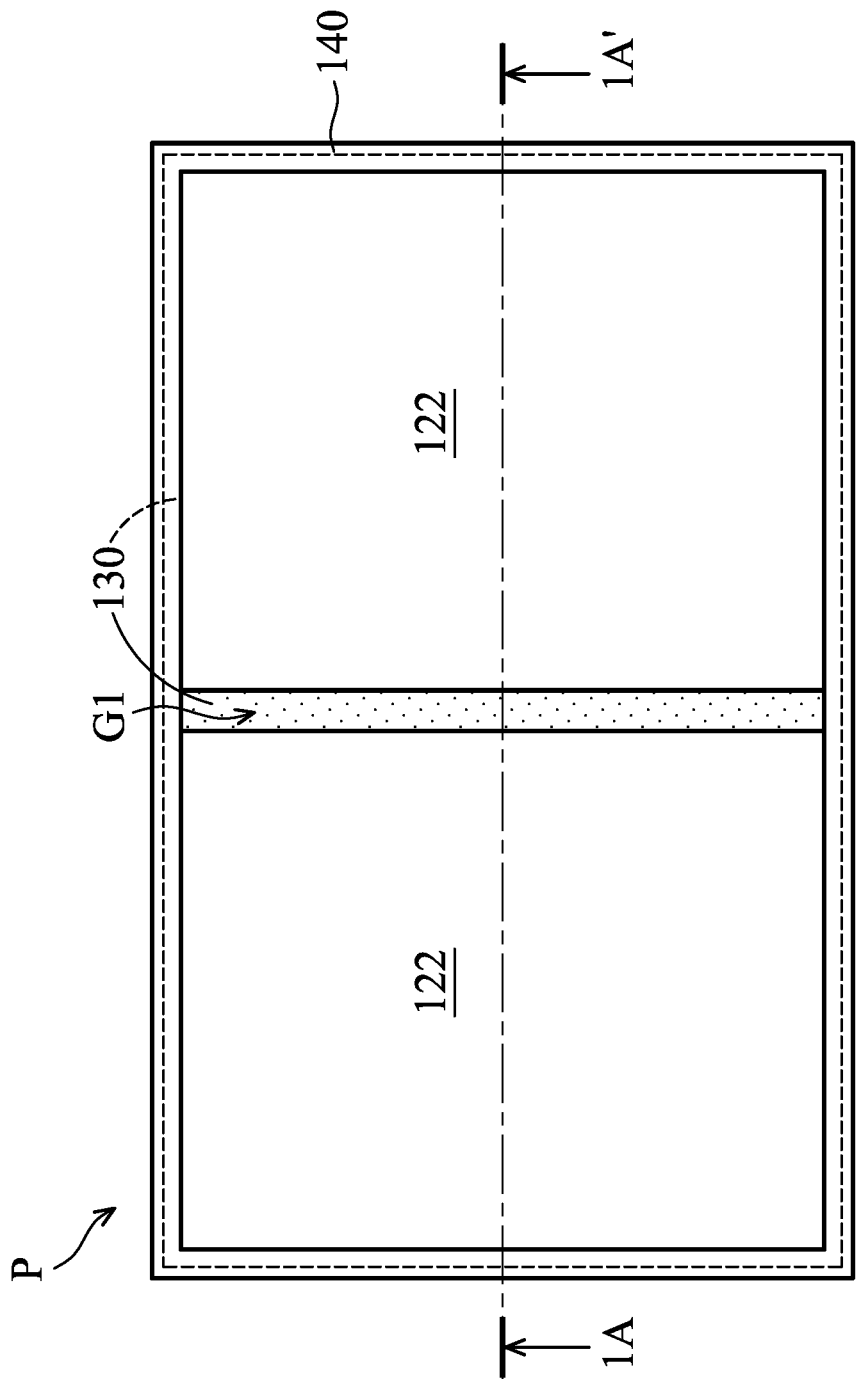

FIGS. 1A-1E are cross-sectional views of various stages of a process for forming a chip package structure, in accordance with some embodiments. FIG. 1A-1 is a top view of the chip package structure of FIG. 1A, in accordance with some embodiments.

As shown in FIGS. 1A and 1A-1, a package P is provided, in accordance with some embodiments. The package P includes a redistribution structure 110, chip structures 122, conductive pillars 124, an underfill layer 130, and a molding layer 140, in accordance with some embodiments. The redistribution structure 110 includes wiring layers 112, conductive vias 114, and a dielectric layer 116, in accordance with some embodiments.

The wiring layers 112 and the conductive vias 114 are formed in the dielectric layer 116, in accordance with some embodiments. As shown in FIG. 1A, the conductive vias 114 are electrically connected between different wiring layers 112, in accordance with some embodiments. For the sake of simplicity, FIG. 1A only shows two of the wiring layers 112, in accordance with some embodiments.

The dielectric layer 116 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments.

The dielectric layer 116 is formed using deposition processes (e.g. chemical vapor deposition processes or physical vapor deposition processes), photolithography processes, and etching processes, in accordance with some embodiments. The wiring layers 112 and the conductive vias 114 are made of a conductive material, such as metal (e.g. copper, aluminum, or tungsten) or alloys thereof, in accordance with some embodiments.

The chip structures 122 are bonded to the redistribution structure 110 through the conductive pillars 124, in accordance with some embodiments. The chip structures 122 are spaced apart from each other by a gap G1, in accordance with some embodiments. The conductive pillars 124 are physically and electrically connected between the chip structures 122 and the redistribution structure 110, in accordance with some embodiments. Each chip structure 122 includes a chip, such as a system on chip (SoC), in accordance with some embodiments.

The chip includes a substrate, in accordance with some embodiments. In some embodiments, the substrate is made of an elementary semiconductor material including silicon or germanium in a single crystal structure, a polycrystal structure, or an amorphous structure. In some other embodiments, the substrate is made of a compound semiconductor, such as silicon carbide, gallium arsenide, gallium phosphide, indium phosphide, indium arsenide, an alloy semiconductor, such as SiGe, or GaAsP, or a combination thereof. The substrate may also include multi-layer semiconductors, semiconductor on insulator (SOI) (such as silicon on insulator or germanium on insulator), or a combination thereof.

In some embodiments, the substrate includes various device elements. In some embodiments, the various device elements are formed in and/or over the substrate. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate. The isolation features are used to define active regions and electrically isolate various device elements formed in and/or over the substrate in the active regions. In some embodiments, the isolation features include shallow trench isolation (STI) features, local oxidation of silicon (LOCOS) features, other suitable isolation features, or a combination thereof.

In some other embodiments, the chip structure 122 includes a chip package structure. In some embodiments, the chip package structure includes one chip. In some other embodiments, the chip package structure includes multiple chips, which are arranged side by side or stacked with each other (e.g., a 3D packaging or a 3DIC device).

The conductive pillars 124 are made of a conductive material such as copper (Cu), aluminum (Al), tungsten (W), cobalt (Co), nickel (Ni), or tin (Sn), in accordance with some embodiments. The conductive pillars 124 are formed using a plating process such as an electroplating process, in accordance with some embodiments.

As shown in FIGS. 1A and 1A-1, the underfill layer 130 is between the chip structures 122 and the redistribution structure 110, in accordance with some embodiments.

The underfill layer 130 surrounds the conductive pillars 124 and the chip structures 122, in accordance with some embodiments.

The underfill layer 130 extends into the gap G1, in accordance with some embodiments. The gap G1 is filled with the underfill layer 130, in accordance with some embodiments. The underfill layer 130 is made of an insulating material, such as a polymer material, in accordance with some embodiments.

As shown in FIGS. 1A and 1A-1, the molding layer 140 is formed over the redistribution structure 110 and the underfill layer 130, in accordance with some embodiments. The molding layer 140 surrounds the chip structures 122, the conductive pillars 124, and the underfill layer 130, in accordance with some embodiments. The molding layer 140 is made of an insulating material, such as a polymer material (e.g., epoxy), in accordance with some embodiments.

As shown in FIGS. 1A and 1A-1, the conductive pillars 108 are formed over a bottom surface 111 of the redistribution structure 110, in accordance with some embodiments. The conductive pillars 108 are made of a conductive material such as copper (Cu), aluminum (Al), tungsten (W), cobalt (Co), nickel (Ni), or tin (Sn), in accordance with some embodiments. The conductive pillars 108 are formed using a plating process such as an electroplating process, in accordance with some embodiments.

As shown in FIGS. 1A and 1A-1, solder bumps 150 are formed over the conductive pillars 108, in accordance with some embodiments. The solder bumps 150 are made of tin (Sn) or another suitable conductive material with a melting point lower than that of the conductive pillars 108, in accordance with some embodiments. The solder bumps 150 are formed using a plating process such as an electroplating process, in accordance with some embodiments.

Figure 1B:
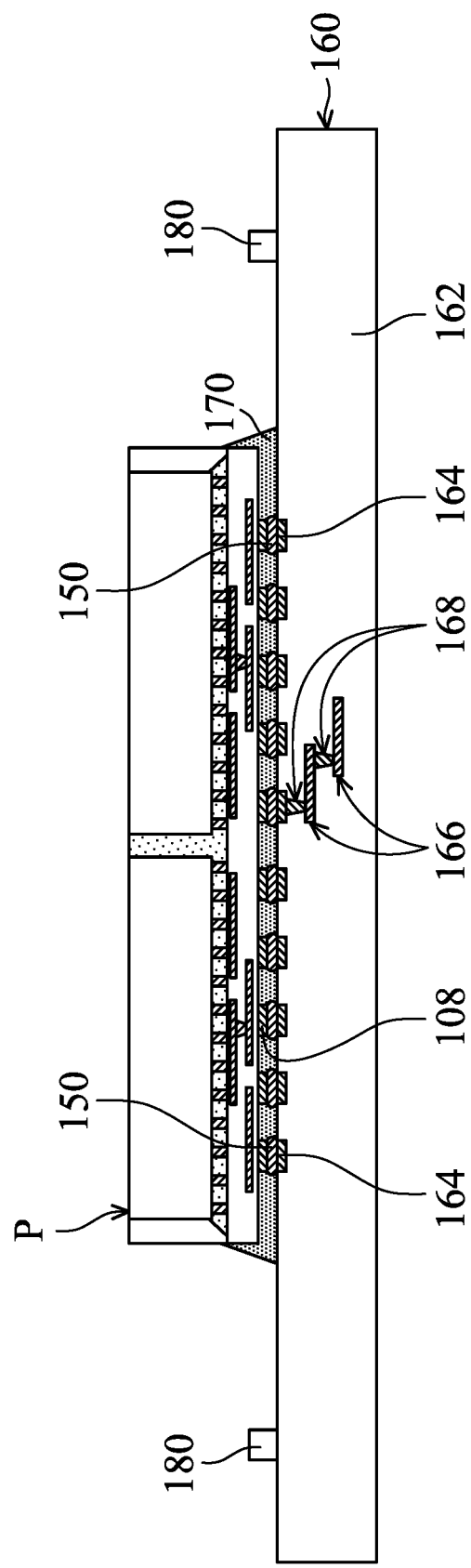
Figures 1, 1B:
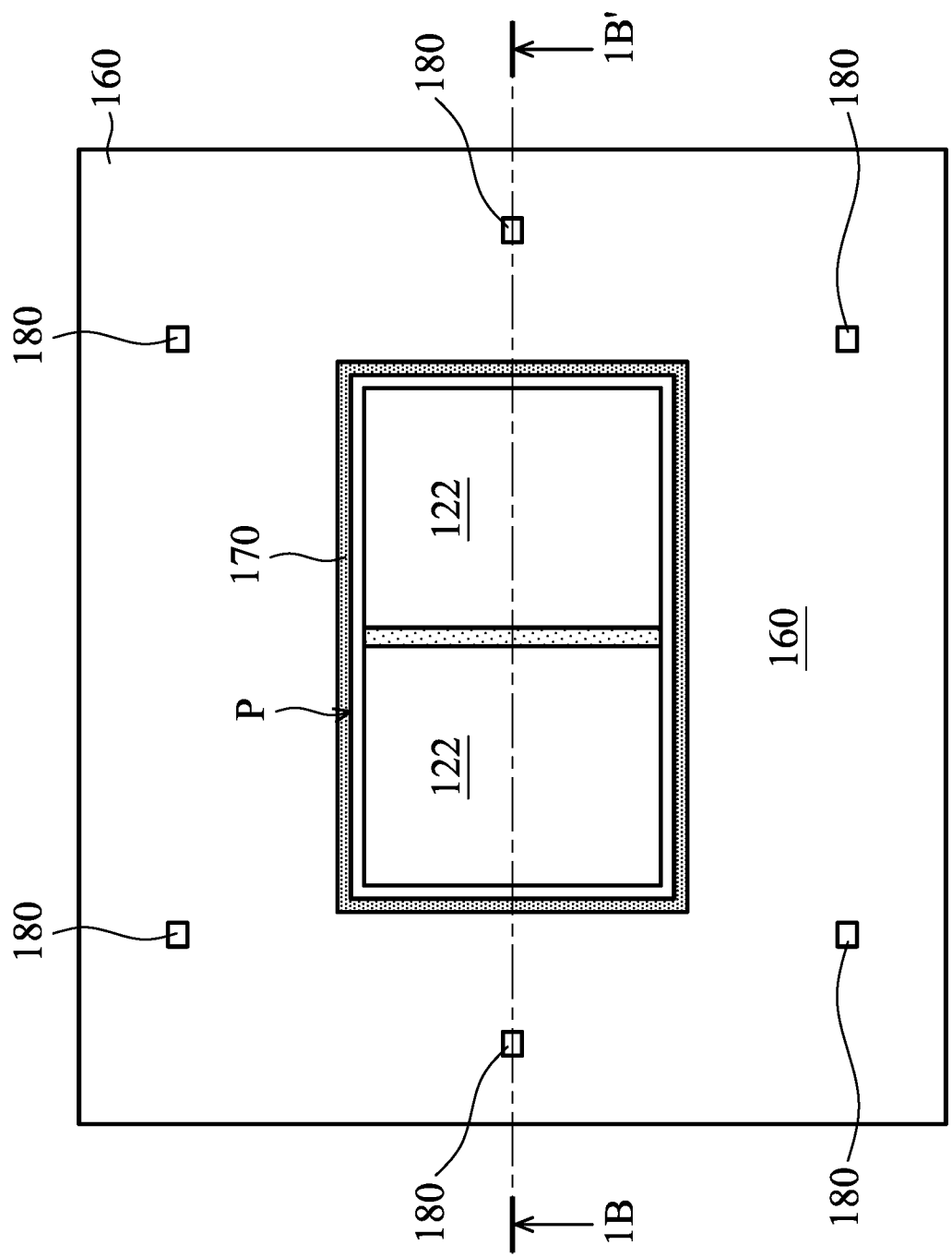

FIG. 1B-1 is a top view of the chip package structure of FIG. 1B, in accordance with some embodiments. As shown in FIGS. 1B and 1B-1, the package P is bonded to a wiring substrate 160 through the solder bumps 150, in accordance with some embodiments. The wiring substrate 160 includes a dielectric layer 162, conductive pads 164, wiring layers 166, and conductive vias 168, in accordance with some embodiments.

The conductive pads 164 are formed over the dielectric layer 162, in accordance with some embodiments. The solder bumps 150 are bonded to the conductive pads 164, in accordance with some embodiments. The wiring layers 166 and the conductive vias 168 are formed in the dielectric layer 162, in accordance with some embodiments.

The conductive vias 168 are electrically connected between different wiring layers 166 and between the wiring layer 166 and the conductive pads 164, in accordance with some embodiments. For the sake of simplicity, FIG. 1B only shows two of the wiring layers 166, in accordance with some embodiments.

The dielectric layer 162 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The dielectric layer 162 is formed using deposition processes (e.g. chemical vapor deposition processes or physical vapor deposition processes), photolithography processes, and etching processes, in accordance with some embodiments.

The conductive pads 164 are made of a conductive material, such as metal (e.g. copper, aluminum, or tungsten) or alloys thereof, in accordance with some embodiments. The wiring layers 166 are made of a conductive material, such as metal (e.g. copper, aluminum, or tungsten) or alloys thereof, in accordance with some embodiments. The conductive vias 168 are made of a conductive material, such as metal (e.g. copper, aluminum, or tungsten) or alloys thereof, in accordance with some embodiments.

In some embodiments, the conductive pads 164, the wiring layers 166, and the conductive vias 168 are made of the same material. In some other embodiments, the conductive pads 164, the wiring layers 166, and the conductive vias 168 are made of different materials.

As shown in FIGS. 1B and 1B-1, an underfill layer 170 is formed between the package P and the wiring substrate 160, in accordance with some embodiments. The underfill layer 170 surrounds the conductive pillars 108, the solder bumps 150 and the package P, in accordance with some embodiments. The underfill layer 170 is made of an insulating material, such as a polymer material, in accordance with some embodiments.

As shown in FIGS. 1B and 1B-1, devices 180 are bonded to the wiring substrate 160 by, for example, surface mount technology (SMT), in accordance with some embodiments. The devices 180 include passive devices, other suitable devices, or combinations thereof. The passive devices include resistors, capacitors, inductors, or other suitable passive devices.

Figure 1C:
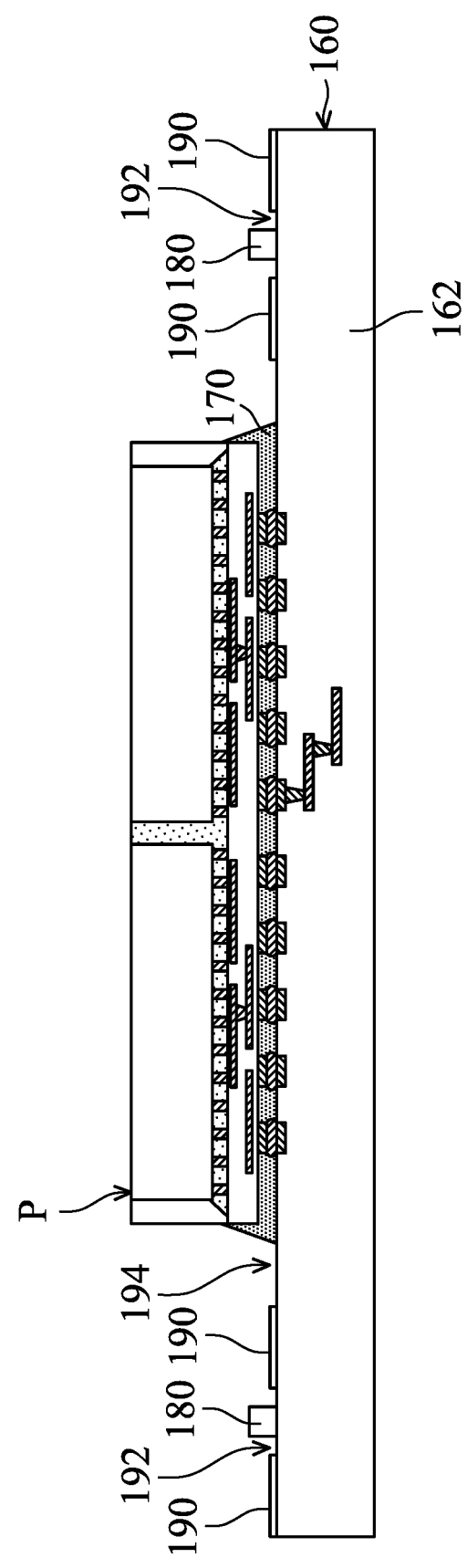
Figures 1, 1C:
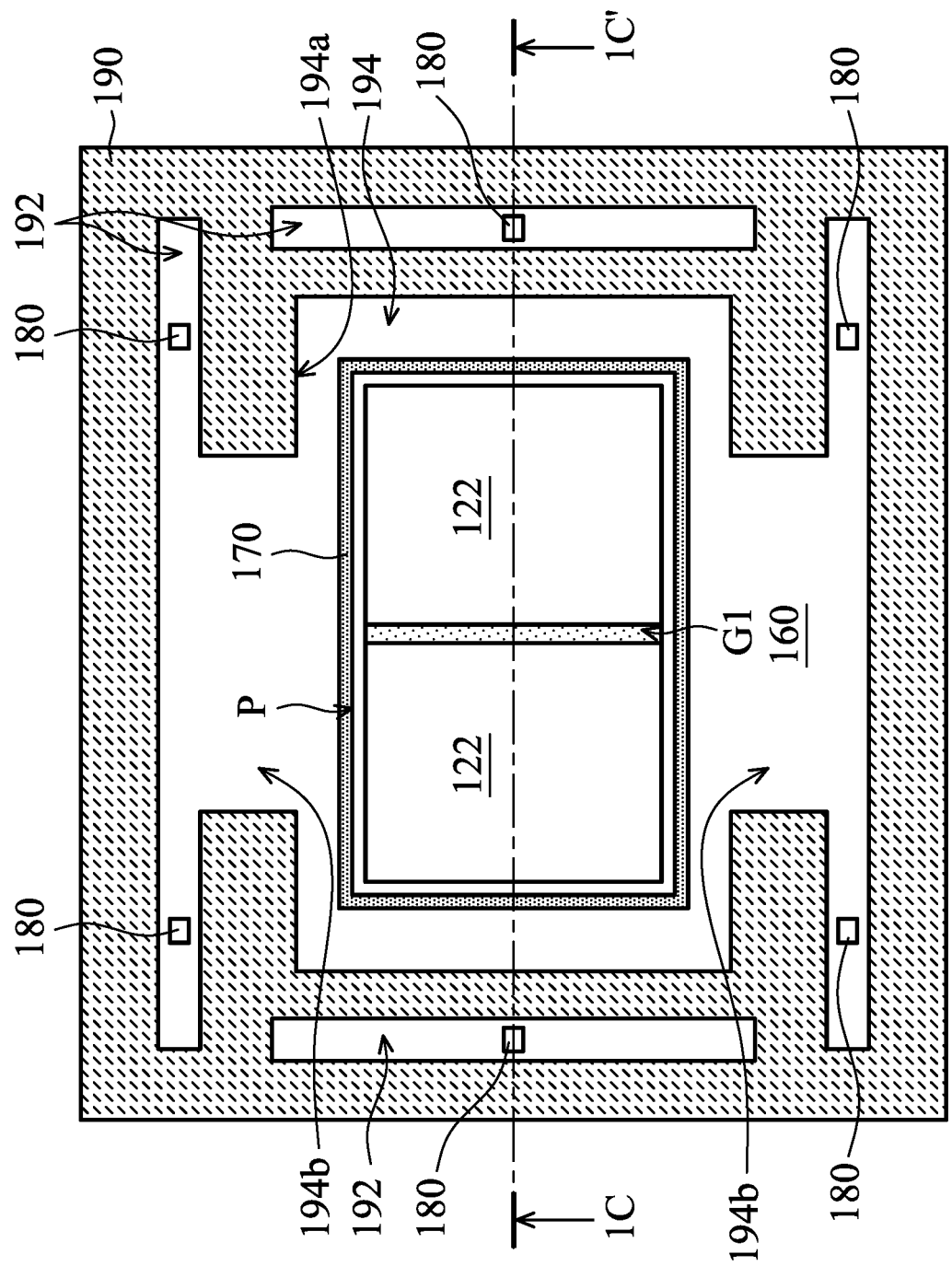

FIG. 1C-1 is a top view of the chip package structure of FIG. 1C, in accordance with some embodiments. As shown in FIGS. 1C and 1C-1, an adhesive layer 190 is formed over the wiring substrate 160, in accordance with some embodiments. The adhesive layer 190 has trenches 192 and an opening 194, in accordance with some embodiments. The devices 180 are in the trenches 192, in accordance with some embodiments. The package P is in the opening 194, in accordance with some embodiments.

The trenches 192 surround the opening 194, in accordance with some embodiments. The opening 194 has an inner wall 194a, in accordance with some embodiments. The inner wall 194a has recesses 194b, in accordance with some embodiments. Each recess 194b communicates with the corresponding trench 192, in accordance with some embodiments. The gap G1 extends toward the recesses 194b, in accordance with some embodiments. The adhesive layer 190 is made of a polymer material such as epoxy or silicone, in accordance with some embodiments.

Figure 1D:
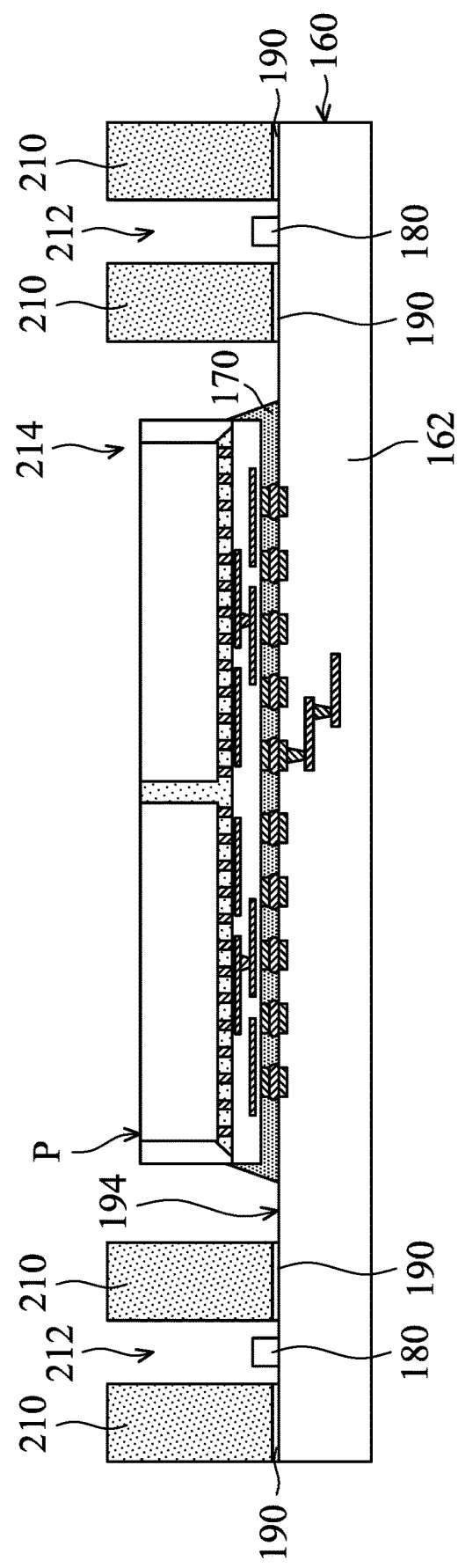
Figures 1, 1D:
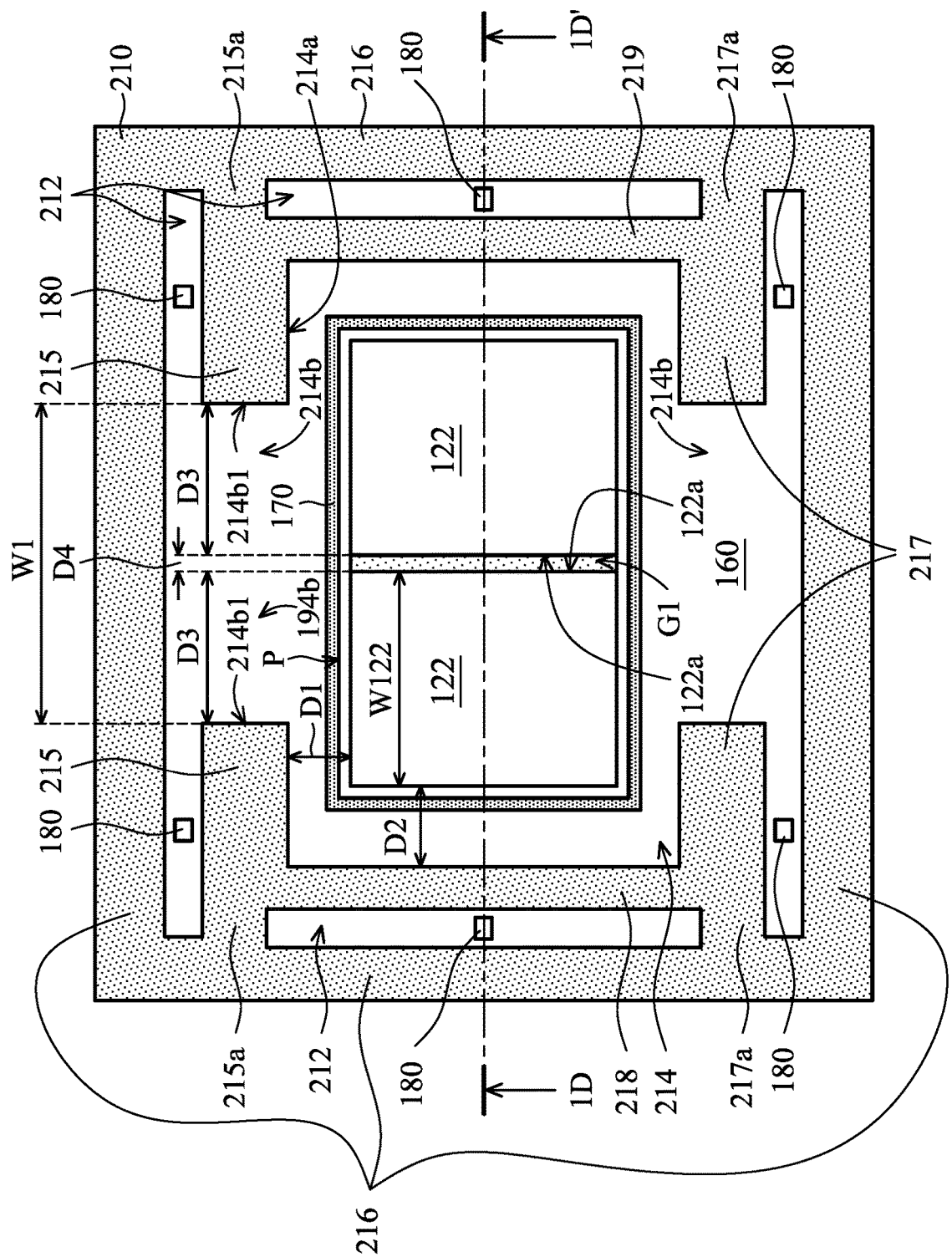
Figures 1, 1D, 2:
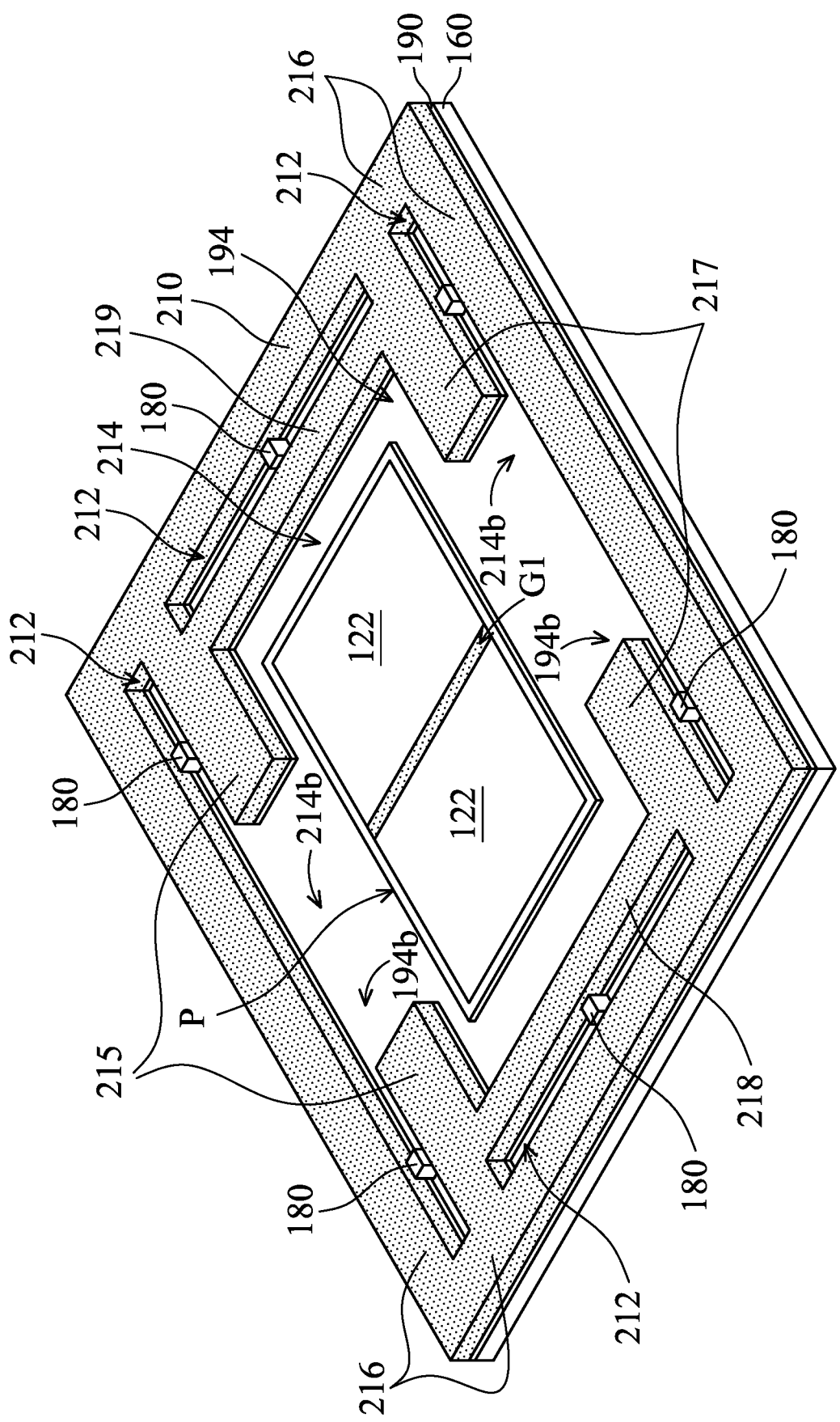
Figures 1, 1D, 2, 3:
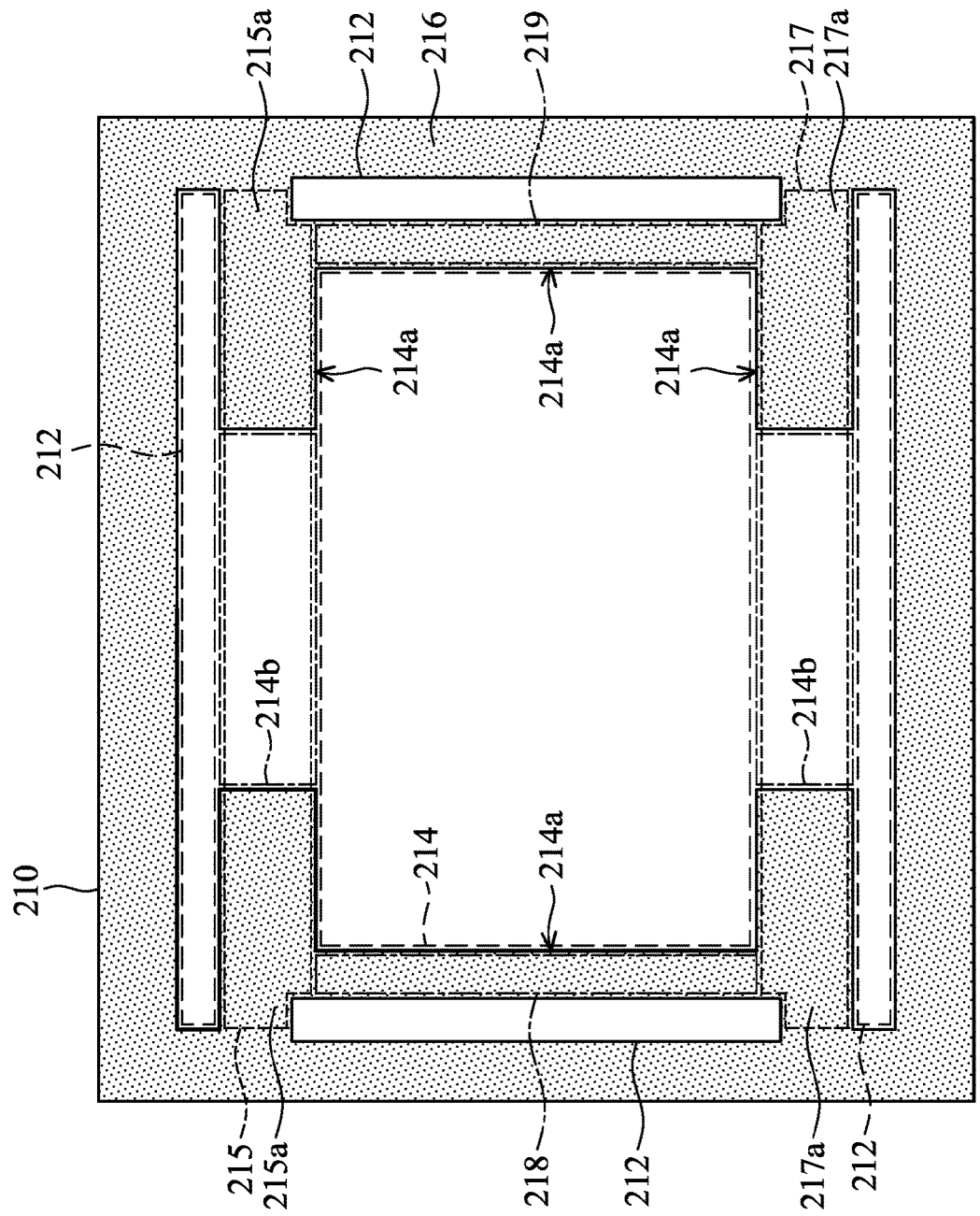

FIG. 1D-1 is a top view of the chip package structure of FIG. 1D, in accordance with some embodiments. FIG. 1D-2 is a perspective view of the chip package structure of FIG. 1D, in accordance with some embodiments. For the sake of simplicity, FIG. 1D-2 omits the underfill layer 170.

As shown in FIGS. 1D, 1D-1 and 1D-2, a ring structure 210 is disposed over the adhesive layer 190, in accordance with some embodiments. FIG. 1D-3 is a top view of the ring structure 210 of the chip package structure of FIG. 1D, in accordance with some embodiments. As shown in FIGS. 1D-1, 1D-2, and 1D-3, the ring structure 210 has trenches 212 and an opening 214, in accordance with some embodiments. The trenches 212 surround the opening 214, in accordance with some embodiments.

The trenches 212 have a substantially rectangular shape, in accordance with some embodiments. The opening 214 have a substantially rectangular shape, in accordance with some embodiments. The trenches 212 are respectively adjacent to four inner walls 214a of the opening 214, in accordance with some embodiments. The devices 180 are in the trenches 212, in accordance with some embodiments. The trenches 212 and the opening 214 are formed using a milling process or a wire cutting process, in accordance with some embodiments.

As shown in FIGS. 1D, 1D-1, and 1D-2, the opening 194 of the adhesive layer 190 is under the opening 214, in accordance with some embodiments. As shown in FIGS. 1D-1, 1D-2, and 1D-3, the package P is in the opening 214, in accordance with some embodiments. Two of the inner walls 214a have recesses 214b, in accordance with some embodiments. Each recess 214b communicates with the corresponding trench 212 and the opening 214, in accordance with some embodiments. The recesses 214b have a substantially rectangular shape, in accordance with some embodiments.

The gap G1 extends toward the recesses 214b, in accordance with some embodiments. The recess 194b of the adhesive layer 190 is under the recess 214b, in accordance with some embodiments. The recesses 214b and 194b have a substantially same width W1, in accordance with some embodiments.

The ring structure 210 has an outer ring 216 and strip portions 215, 217, 218 and 219, in accordance with some embodiments. The strip portions 215, 217, 218 and 219 are also referred to as ribs, in accordance with some embodiments. The strip portions 215, 217, 218 and 219 are surrounded by the outer ring 216, in accordance with some embodiments.

The strip portion 215 has a substantially rectangular shape, in accordance with some embodiments. The strip portion 215 has opposite ends 215a connected to the outer ring 216, in accordance with some embodiments. The recess 214b is in the strip portion 215, in accordance with some embodiments. The recess 214b passes through the strip portion 215, in accordance with some embodiments.

The strip portion 217 has a substantially rectangular shape, in accordance with some embodiments. The strip portion 217 has opposite ends 217a, in accordance with some embodiments. The ends 217a are connected to the outer ring 216, in accordance with some embodiments. The recess 214b is in the strip portion 217, in accordance with some embodiments. The recess 214b passes through the strip portion 217, in accordance with some embodiments.

The strip portion 218 has a substantially rectangular shape, in accordance with some embodiments. The strip portion 218 is between the strip portions 215 and 217, in accordance with some embodiments. The strip portion 218 is connected to the strip portions 215 and 217, in accordance with some embodiments.

The strip portion 219 has a substantially rectangular shape, in accordance with some embodiments. The strip portion 219 is between the strip portions 215 and 217, in accordance with some embodiments. The strip portion 219 is connected to the strip portions 215 and 217, in accordance with some embodiments. Accordingly, the strip portions 218, 215 and 217 together form a first I-shaped structure, and the strip portion 219, 215 and 217 together form a second I-shaped structure, in accordance with some embodiments. These two I-shaped structures are disposed on two opposite sides of the package P, in accordance with some embodiments.

In some embodiments, a distance D1 between the chip structure 122 and the strip portion 215 ranges from about 7 mm to about 20 mm, in accordance with some embodiments. If the distance D1 is less than 7 mm, the stress at the corner of the chip structure 122 is large, which is undesirable, in accordance with some embodiments. If the distance D1 is greater than 20 mm, the size of the ring structure 210 is large, which occupies too much surface area of the wiring substrate 160, in accordance with some embodiments.

In some embodiments, a distance D2 between the chip structure 122 and the strip portion 218 ranges from about 7 mm to about 20 mm, in accordance with some embodiments. If the distance D2 is less than 7 mm, the stress at the corner of the chip structure 122 is large, which is undesirable, in accordance with some embodiments. If the distance D2 is greater than 20 mm, the size of the ring structure 210 is large, which occupies too much surface area of the wiring substrate 160, in accordance with some embodiments.

The chip structure 122 has a width W122, in accordance with some embodiments. Each chip structure 122 has a sidewall 122a facing the gap G1, in accordance with some embodiments. In some embodiments, a lateral distance D3 is between the sidewall 122a and an inner wall 214b1 of the recess 214b. In some embodiments, a ratio of the lateral distance D3 to the width W122 ranges from about 0.3 to about 0.7. In some embodiments, the ratio (D 3/W122) ranges from about 0.5 to about 0.7. In some embodiments, a distance D4 between the sidewalls 122a ranges from about 40 nm to about 120 nm.

The ring structure 210 is made of a rigid material, such as metal (e.g., copper or iron), alloys thereof (e.g., stainless steel), or another suitable material which is more rigid than the wiring substrate 160, in accordance with some embodiments.

Figure 1E:
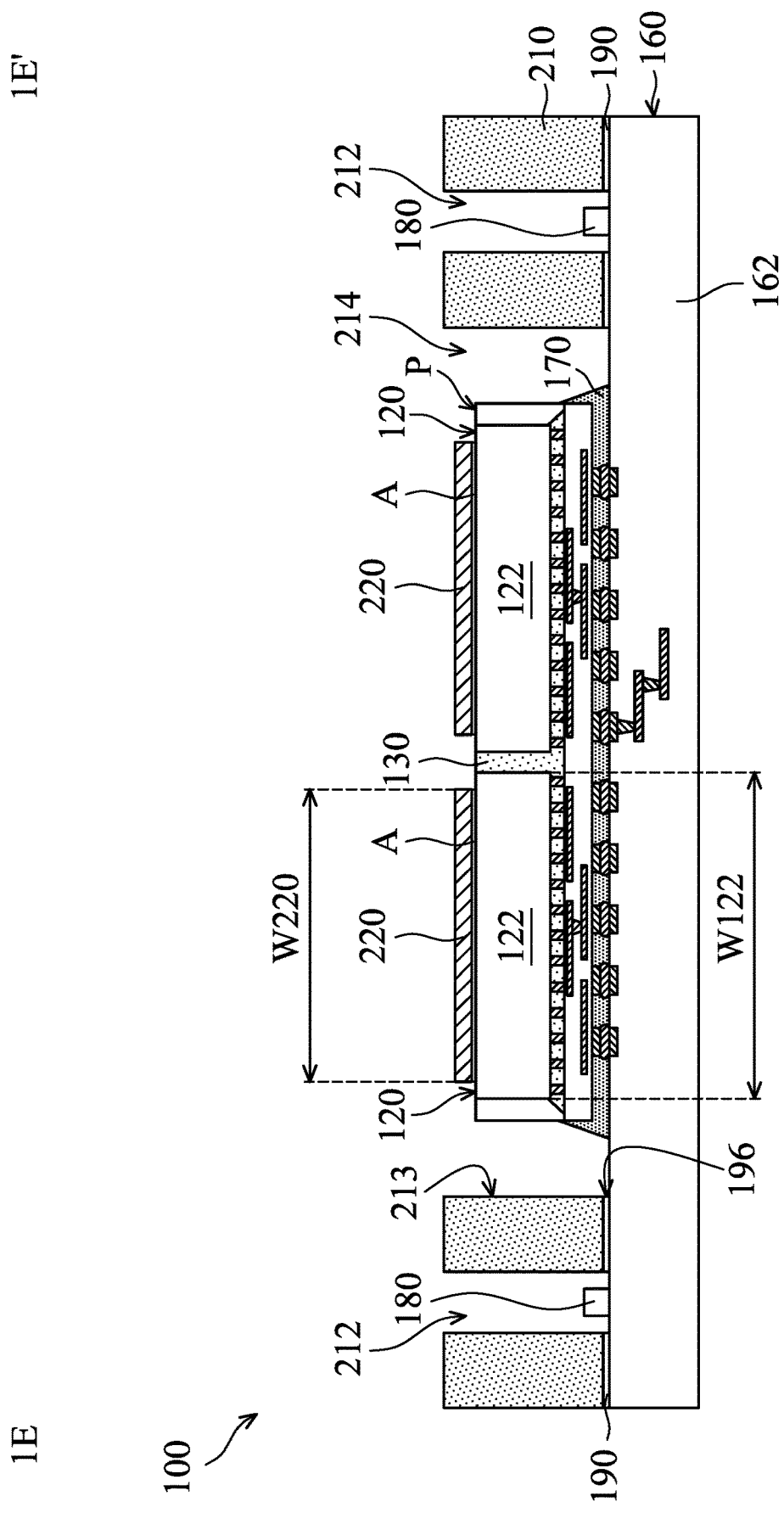
Figures 1, 1E:
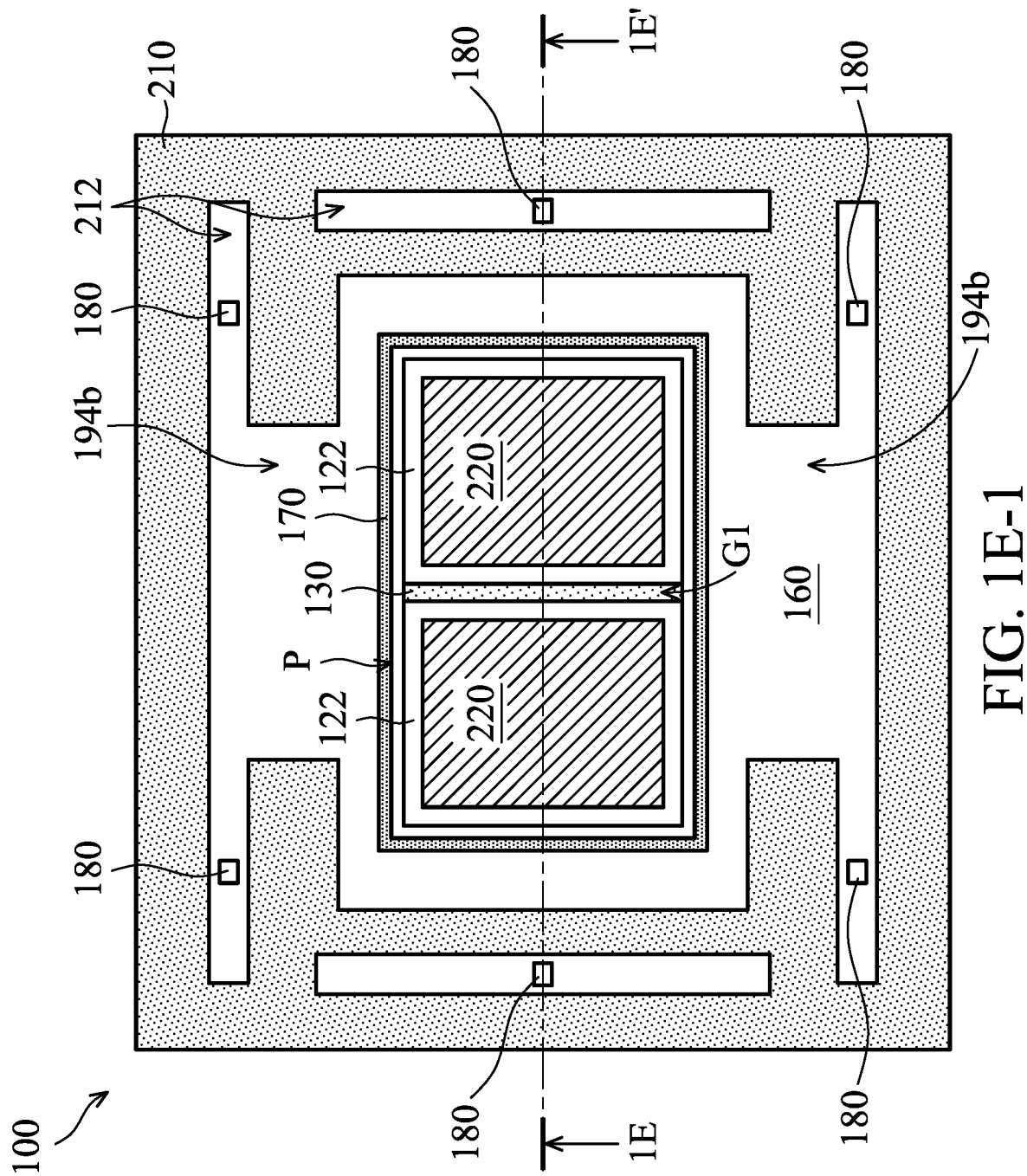
Figures 1, 1E, 2:
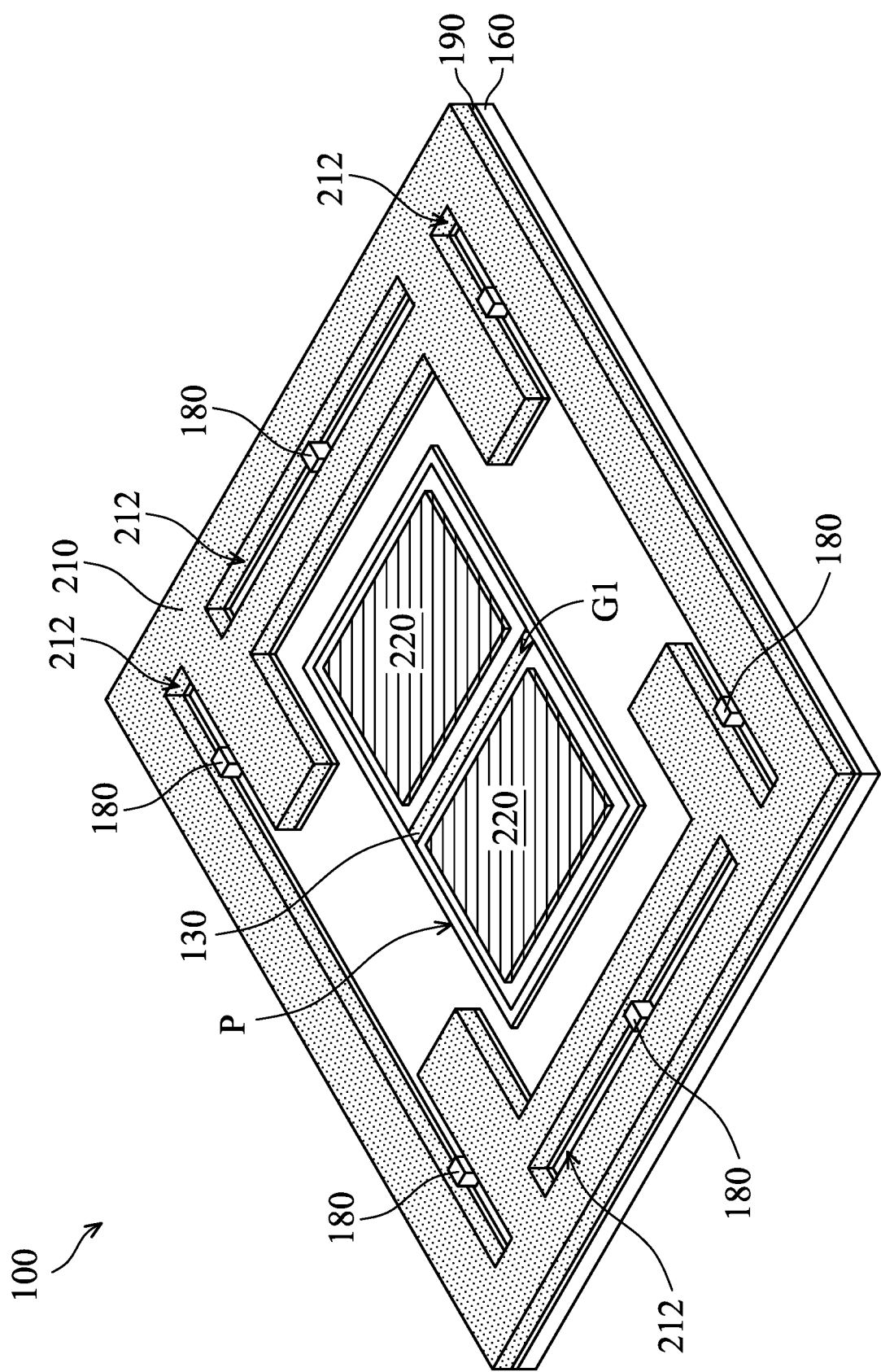

FIG. 1E-1 is a top view of the chip package structure of FIG. 1E, in accordance with some embodiments. FIG. 1E-2 is a perspective view of the chip package structure of FIG. 1E, in accordance with some embodiments. For the sake of simplicity, FIG. 1E-2 omits the underfill layer 170 and the adhesive layer A.

As shown in FIGS. 1E, 1E-1 and 1E-2, lids 220 are respectively disposed over the chip structures 122, in accordance with some embodiments. In this step, a chip package structure 100 is substantially formed, in accordance with some embodiments. The lid 220 is narrower than the chip structure 122 thereunder, in accordance with some embodiments. That is, a width W220 of the lid 220 is less than a width W122 of the chip structures 122, in accordance with some embodiments.

The lid 220 is made of a high thermal conductivity material, such as a metal material (aluminum or copper), an alloy material (e.g., stainless steel), or aluminum-silicon carbide (AlSiC), in accordance with some embodiments.

In some embodiments, as shown in FIG. 1E, an adhesive layer A is formed between the lids 220 and the chip structures 122. The adhesive layer A is made of a combination of polymer and metal (e.g., a silver paste) or a polymer (e.g., epoxy or silicone), in accordance with some embodiments. For the sake of simplicity, FIGS. 1E-2 omits the underfill layer 170 and the adhesive layer A.

The stress tends to concentrate at the underfill layer 130 in the gap G1 when using a ring structure to reduce the warpage of the wiring substrate 160, in accordance with some embodiments. The stress tends to induce cracks or delamination in the underfill layer 130 in the gap G1, in accordance with some embodiments. Therefore, the method removes a portion of the ring structure 210 closed to the gap G1 to reduce the anti-warpage ability of the ring structure 210 closed to the gap G1, in accordance with some embodiments. As a result, the stress concentrated at the underfill layer 130 in the gap G1 is reduced, in accordance with some embodiments. Since the method only removes a portion of the ring structure 210 closed to the gap G1, the anti-warpage ability of the entire ring structure 210 is substantially maintained within an acceptable range, in accordance with some embodiments. Therefore, the yield of the chip package structure 100 is improved, in accordance with some embodiments.

The lids 220 are able to reduce the warpage of the chip structures 122, which reduces the warpage of the wiring substrate 160, in accordance with some embodiments. Therefore, the yield of the chip package structure 100 is improved, in accordance with some embodiments.

Figure 9:
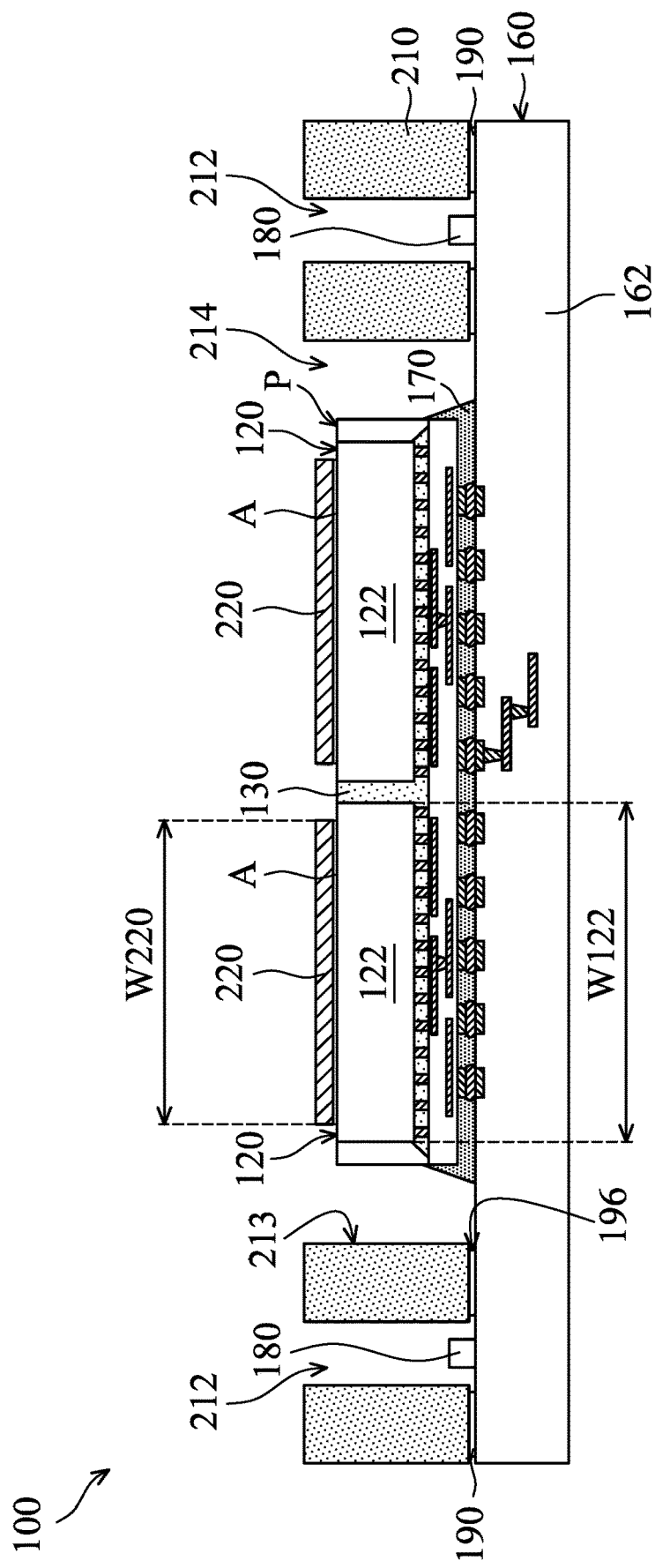
FIG. 9 is a cross-sectional view illustrating a chip package structure, in accordance with some embodiments.
Figure 10:
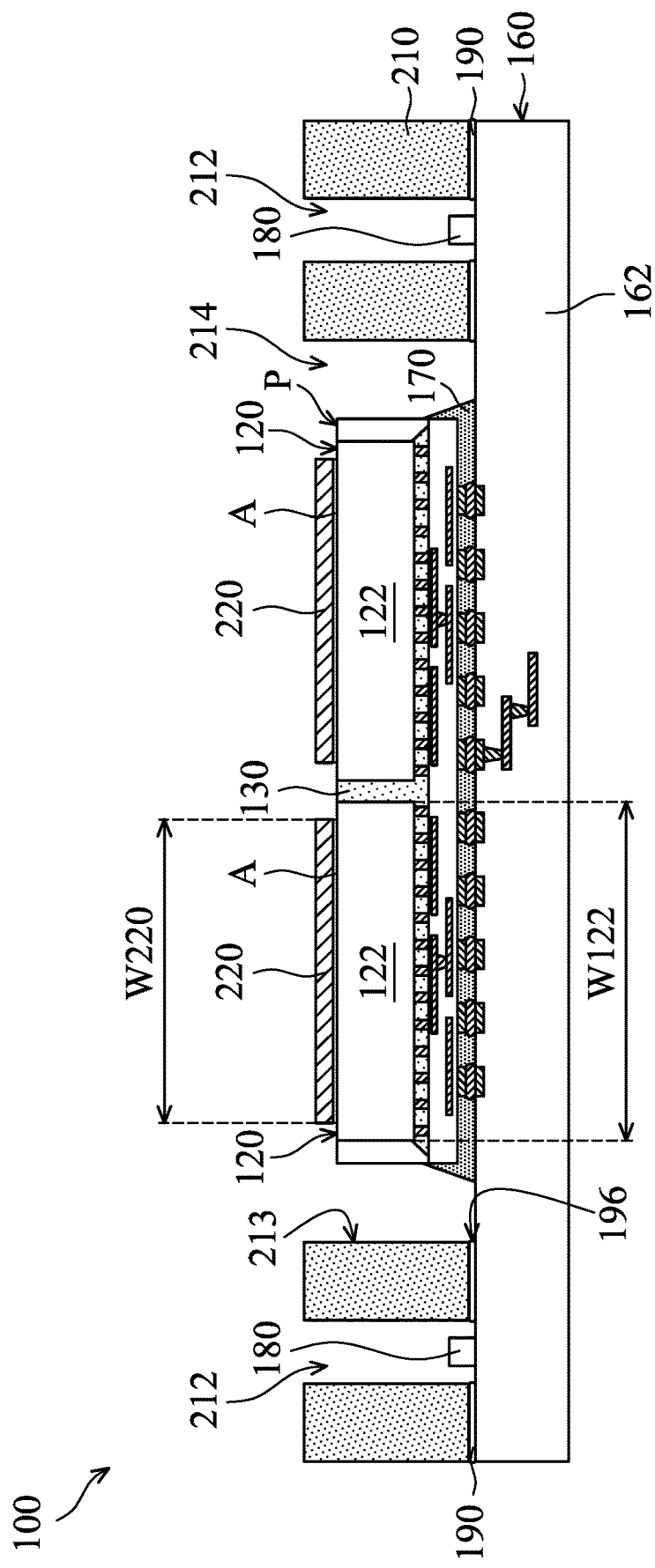
FIG. 10 is a cross-sectional view illustrating a chip package structure, in accordance with some embodiments.

In some embodiments, a sidewall 196 of the adhesive layer 190 is aligned with or substantially coplanar with a sidewall 213 of the ring structure 210. In some other embodiments, as shown in FIG. 9, the sidewall 196 of the adhesive layer 190 is recessed from the sidewall 213 of the ring structure 210. In still other embodiments, as shown in FIG. 10, the sidewall 196 of the adhesive layer 190 is protruded from the sidewall 213 of the ring structure 210.

Figure 2A:
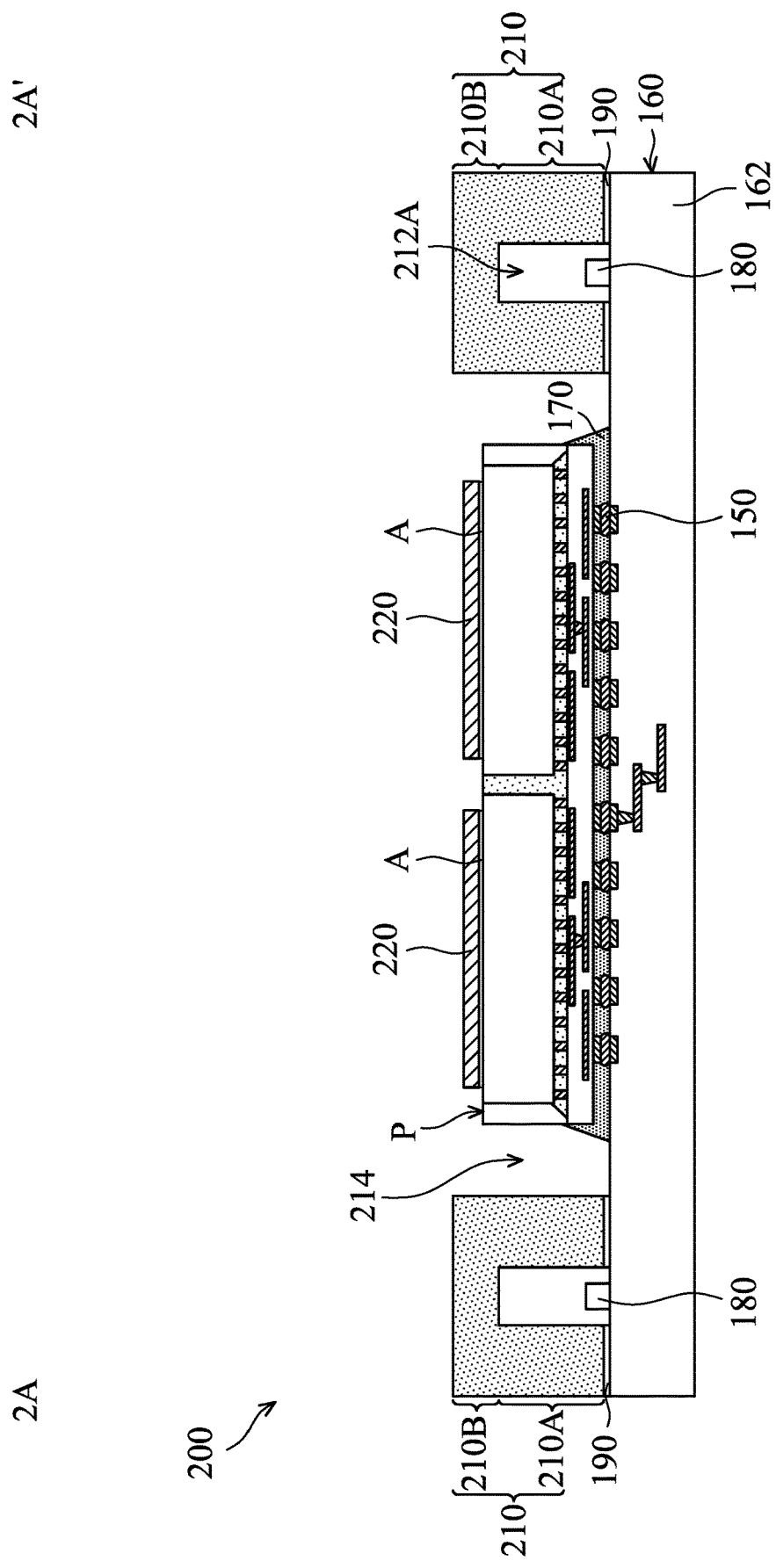
FIG. 2A is a cross-sectional view illustrating a chip package structure, in accordance with some embodiments.
Figure 2B:
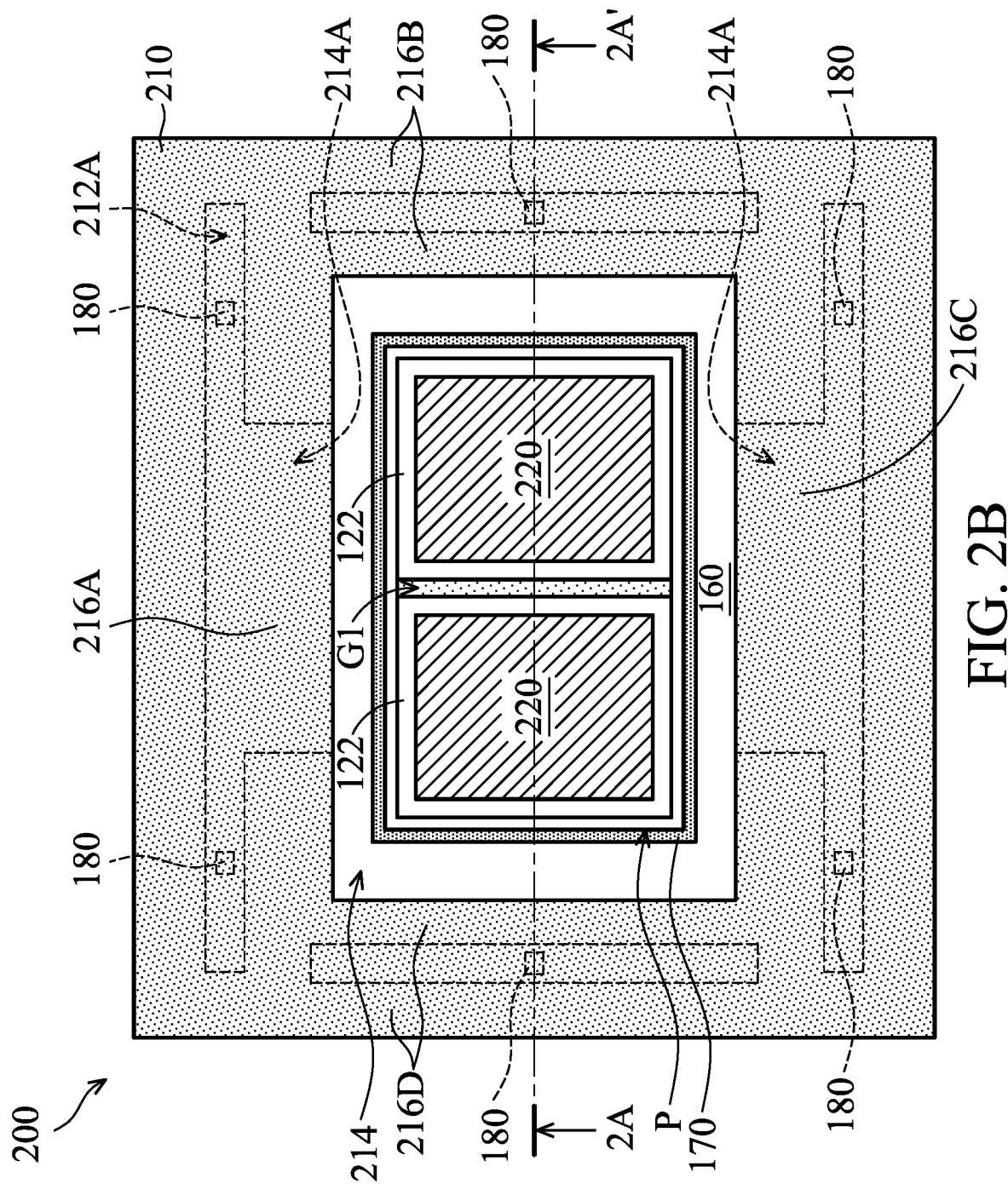
FIG. 2B is a top view illustrating the chip package structure of FIG. 2A, in accordance with some embodiments.
Figure 2C:
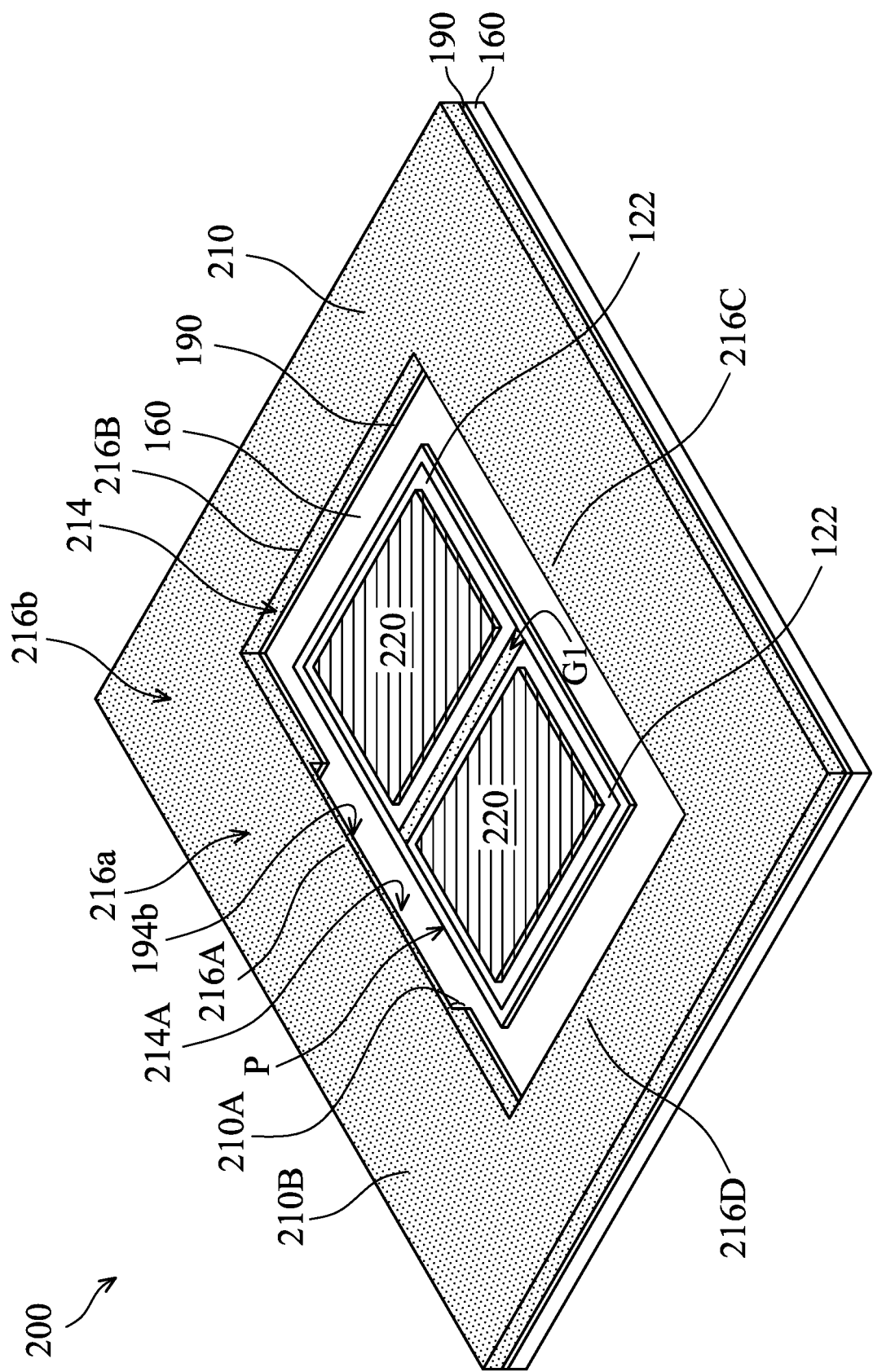
FIG. 2C is a perspective view of the chip package structure of FIG. 2A, in accordance with some embodiments.

FIG. 2A is a cross-sectional view illustrating a chip package structure 200, in accordance with some embodiments. FIG. 2B is a top view illustrating the chip package structure 200 of FIG. 2A, in accordance with some embodiments. FIG. 2C is a perspective view of the chip package structure 200 of FIG. 2A, in accordance with some embodiments. For the sake of simplicity, FIG. 2C omits the underfill layer 170 and the adhesive layer A.

Figure 2D:
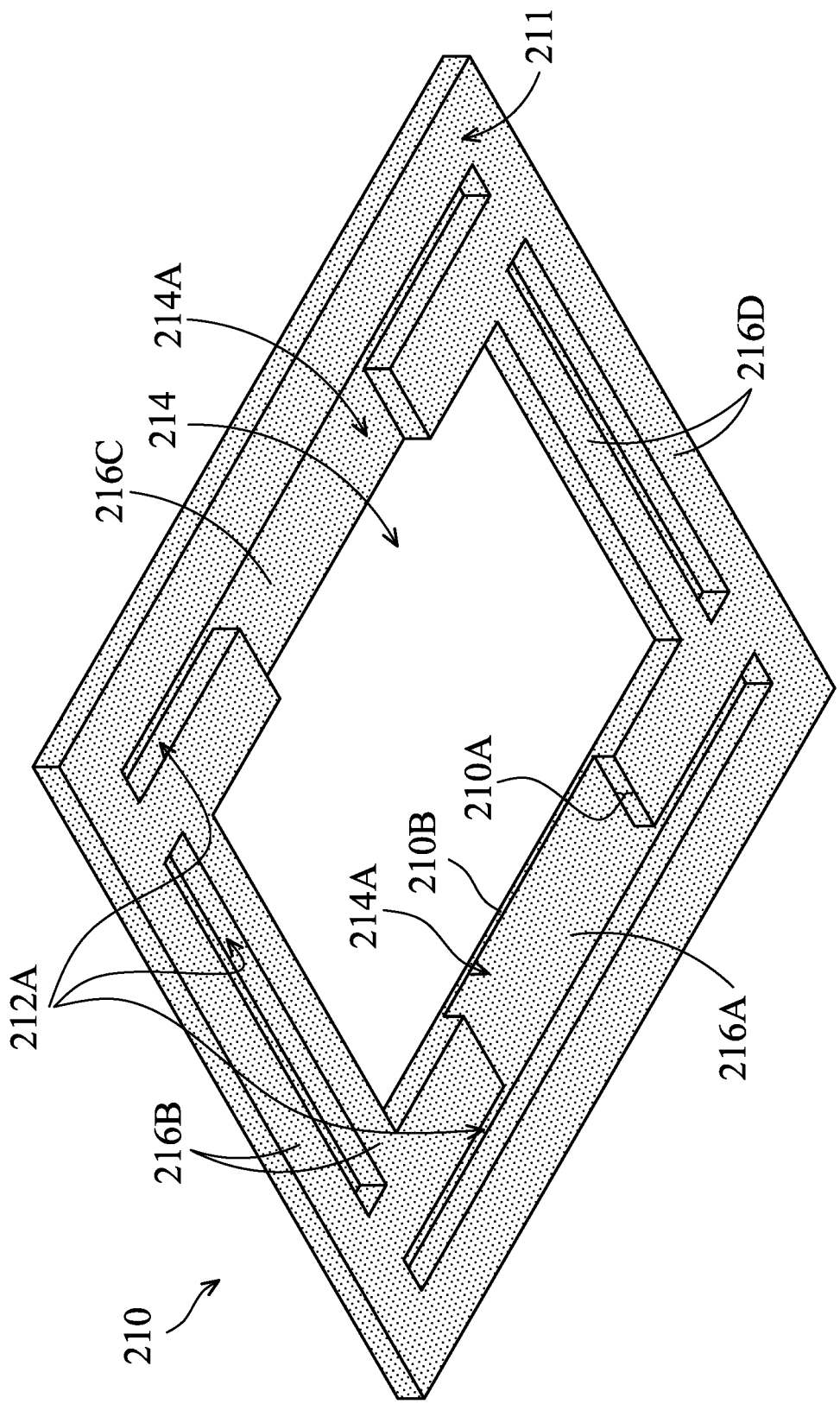
FIG. 2D is a perspective view of the ring structure of FIG. 2A, in accordance with some embodiments.
Figure 2E:
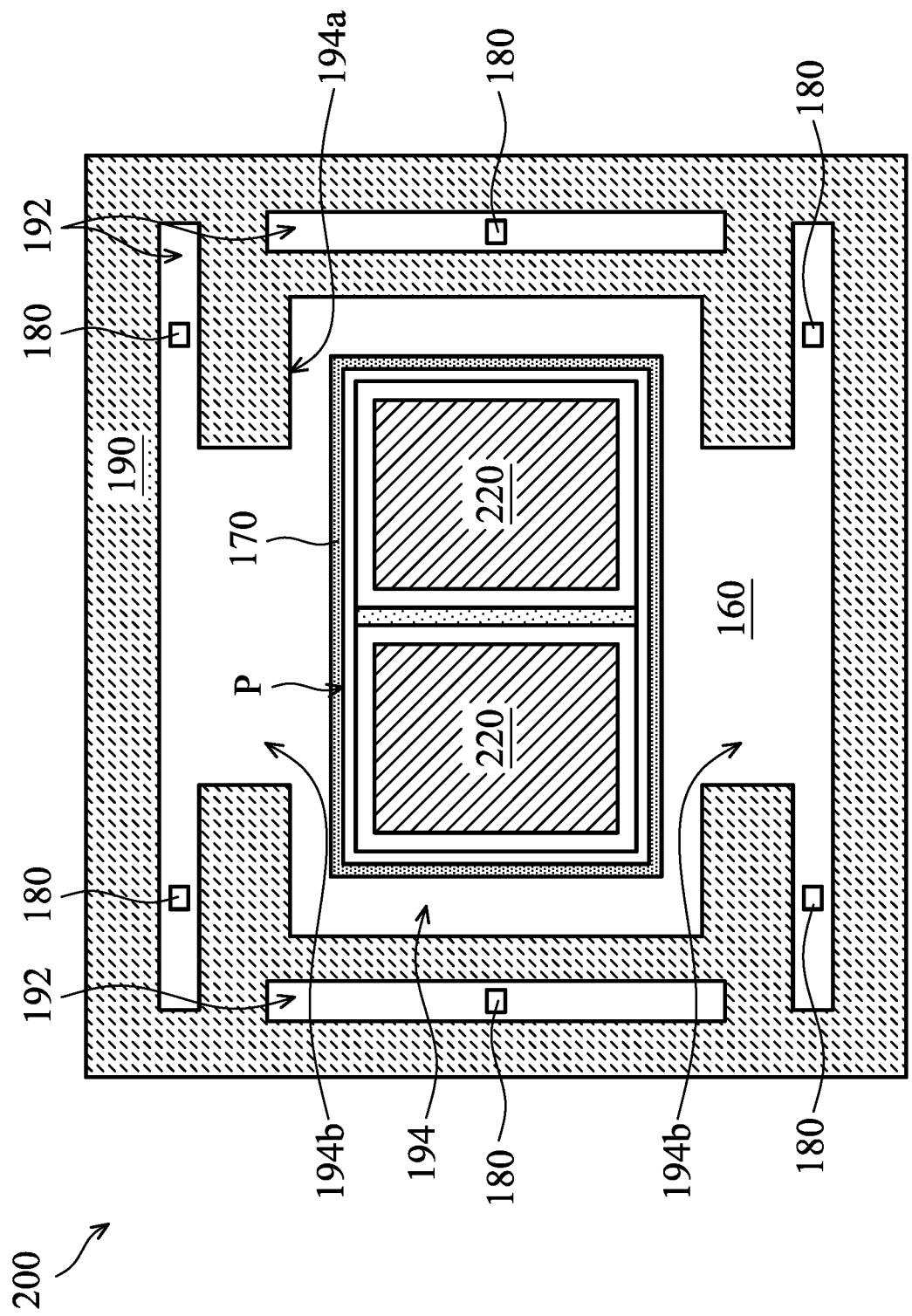
FIG. 2E is a top view illustrating the chip package structure of FIG. 2A without the ring structure, in accordance with some embodiments.

FIG. 2D is a perspective view of the ring structure 210 of FIG. 2A, in accordance with some embodiments. FIG. 2D is viewed from a bottom surface 211 of the ring structure 210, in accordance with some embodiments. FIG. 2E is a top view illustrating the chip package structure 200 of FIG. 2A without the ring structure 210, in accordance with some embodiments.

As shown in FIGS. 2A, 2B, 2C, 2D, and 2E, the chip package structure 200 is similar to the chip package structure 100 of FIG. 1E, except that the ring structure 210 has a lower portion 210A and an upper portion 210B with different structures, in accordance with some embodiments. The ring structure 210 has an opening 214, in accordance with some embodiments. The package P is in the opening 214, in accordance with some embodiments.

The lower portion 210A has a structure similar to that of the ring structure 210 of FIG. 1E, in accordance with some embodiments. As shown in FIGS. 2B and 2D, the lower portion 210A has trenches 212A and recesses 214A, in accordance with some embodiments. The trenches 212A surround the opening 214, in accordance with some embodiments. Each recess 214A communicates with the corresponding trench 212A and the opening 214, in accordance with some embodiments. As shown in FIG. 2A, the devices 180 are in the trenches 212A, in accordance with some embodiments.

As shown in FIGS. 2A, 2B and 2D, the upper portion 210B is a continuous plate over the lower portion 210A and covering the trenches 212A and the recess 214A, in accordance with some embodiments. The upper portion 210B is thinner than the lower portion 210A, in accordance with some embodiments.

As shown in FIGS. 2B, 2C and 2D, the ring structure 210 includes thin portions 216A and 216C and thick portions 216B and 216D, in accordance with some embodiments. The thin portion 216A is opposite to the thin portion 216C, in accordance with some embodiments. The thin portion 216A is connected between the thick portions 216B and 216D, in accordance with some embodiments. The thin portion 216C is connected between the thick portions 216B and 216D, in accordance with some embodiments.

As shown in FIGS. 2B and 2C, the gap G1 between the chip structures 122 extend toward the thin portions 216A and 216C, in accordance with some embodiments. The gap G1 is close to the thin portions 216A and 216C, in accordance with some embodiments. As shown in FIG. 2C, a top surface 216a of the thin portion 216A and a top surface 216b of the thick portion 216B are substantially coplanar, in accordance with some embodiments.

Figure 3A:
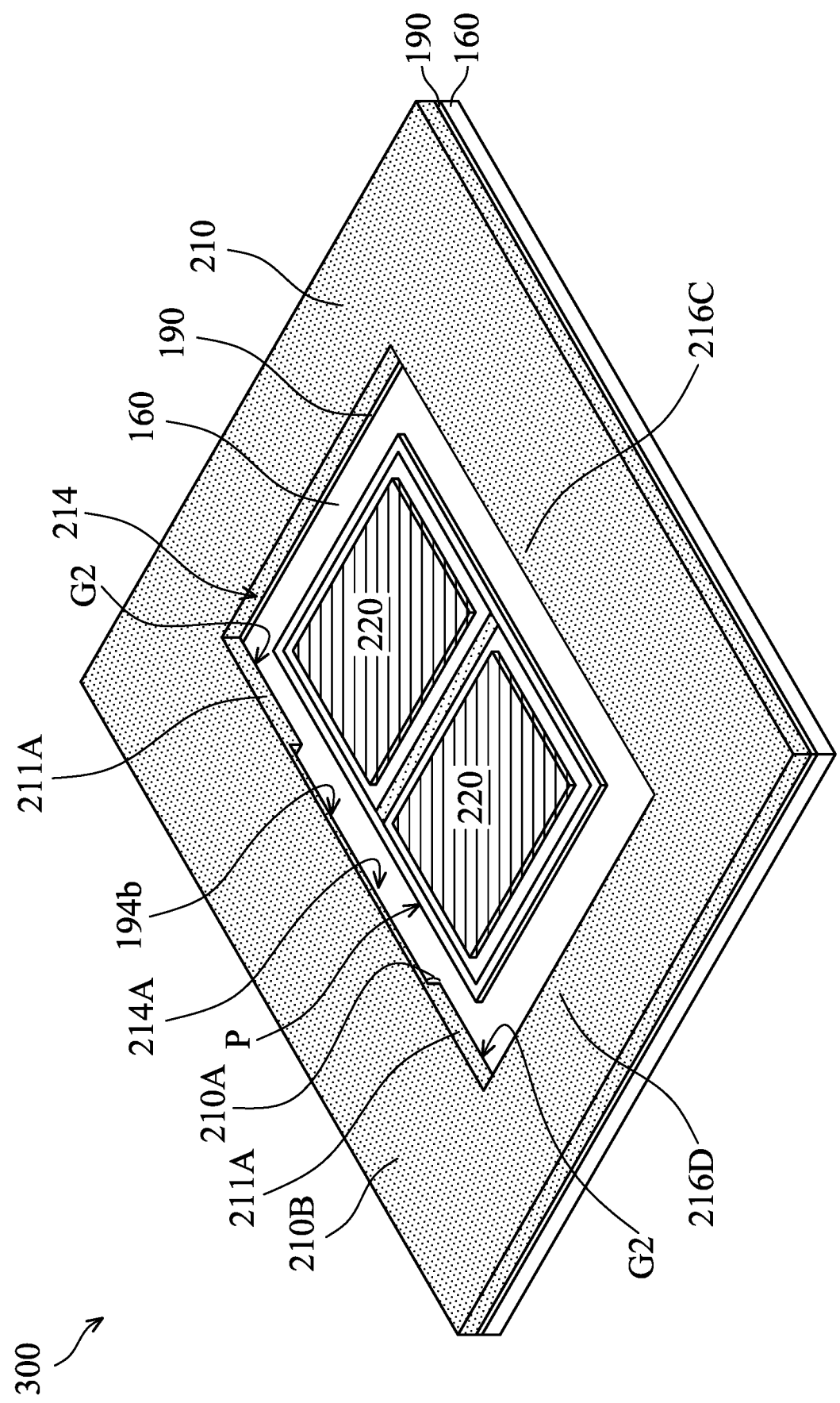
FIG. 3A is a perspective view of a chip package structure, in accordance with some embodiments.
Figure 3B:
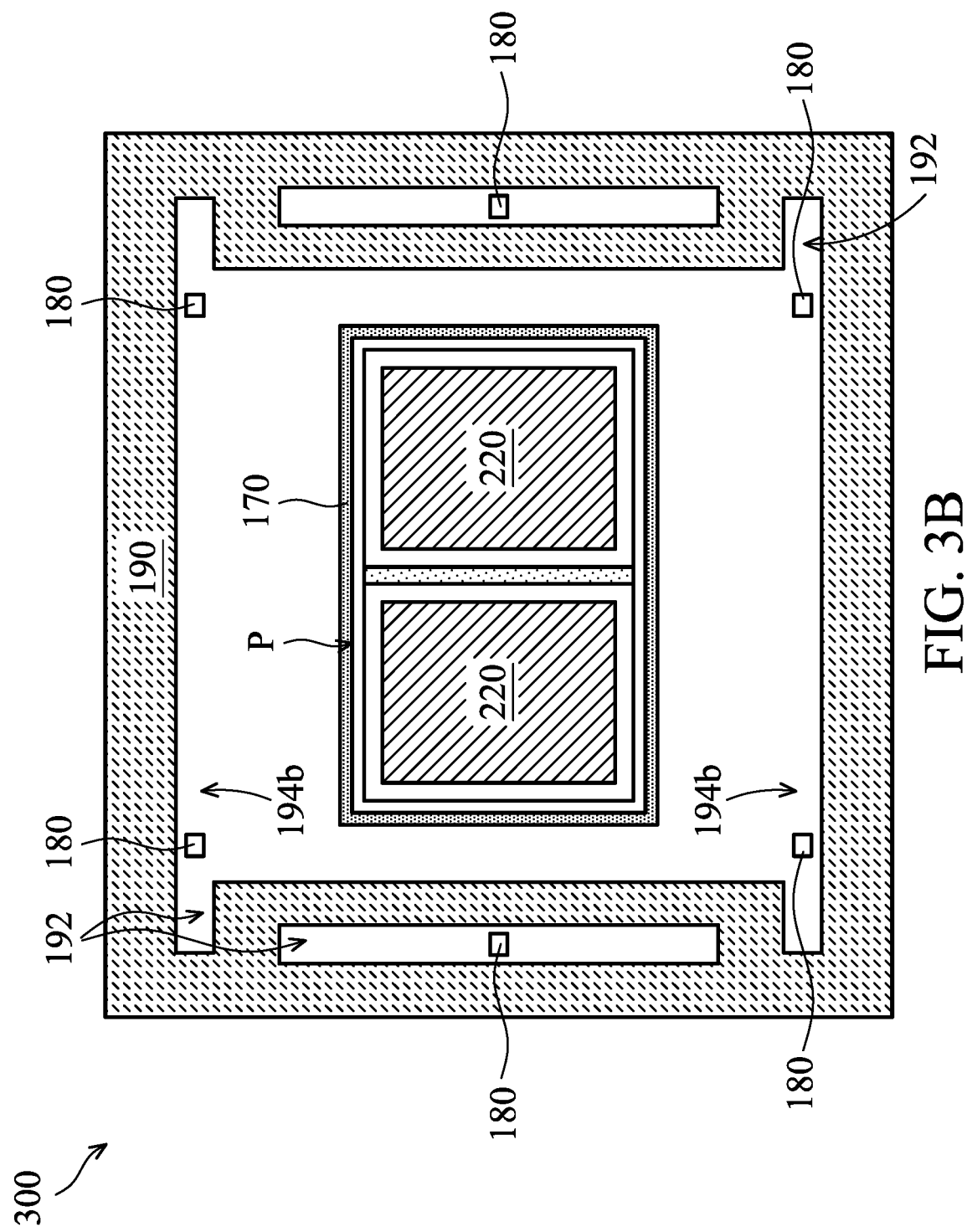
FIG. 3B is a top view illustrating the chip package structure of FIG. 3A without the ring structure, in accordance with some embodiments.

FIG. 3A is a perspective view of a chip package structure 300, in accordance with some embodiments. FIG. 3B is a top view illustrating the chip package structure 300 of FIG. 3A without the ring structure 210, in accordance with some embodiments. For the sake of simplicity, FIG. 3A omits the underfill layer 170 and the adhesive layer A.

As shown in FIGS. 3A and 3B, the chip package structure 300 is similar to the chip package structure 200 of FIGS. 2C and 2E, except that the recesses 194b of the adhesive layer 190 of FIGS. 3A and 3B are wider than the recesses 194b of the adhesive layer 190 of FIGS. 2C and 2E, in accordance with some embodiments.

As shown in FIGS. 3A and 3B, the recess 194b is wider than the recess 214A of the lower portion 210A, in accordance with some embodiments. Therefore, portions 211A of the lower portion 210A are not bonded to the wiring substrate 160 by the adhesive layer 190, in accordance with some embodiments. There are gaps G2 between the portions 211A and the wiring substrate 160, in accordance with some embodiments.

Figure 4A:
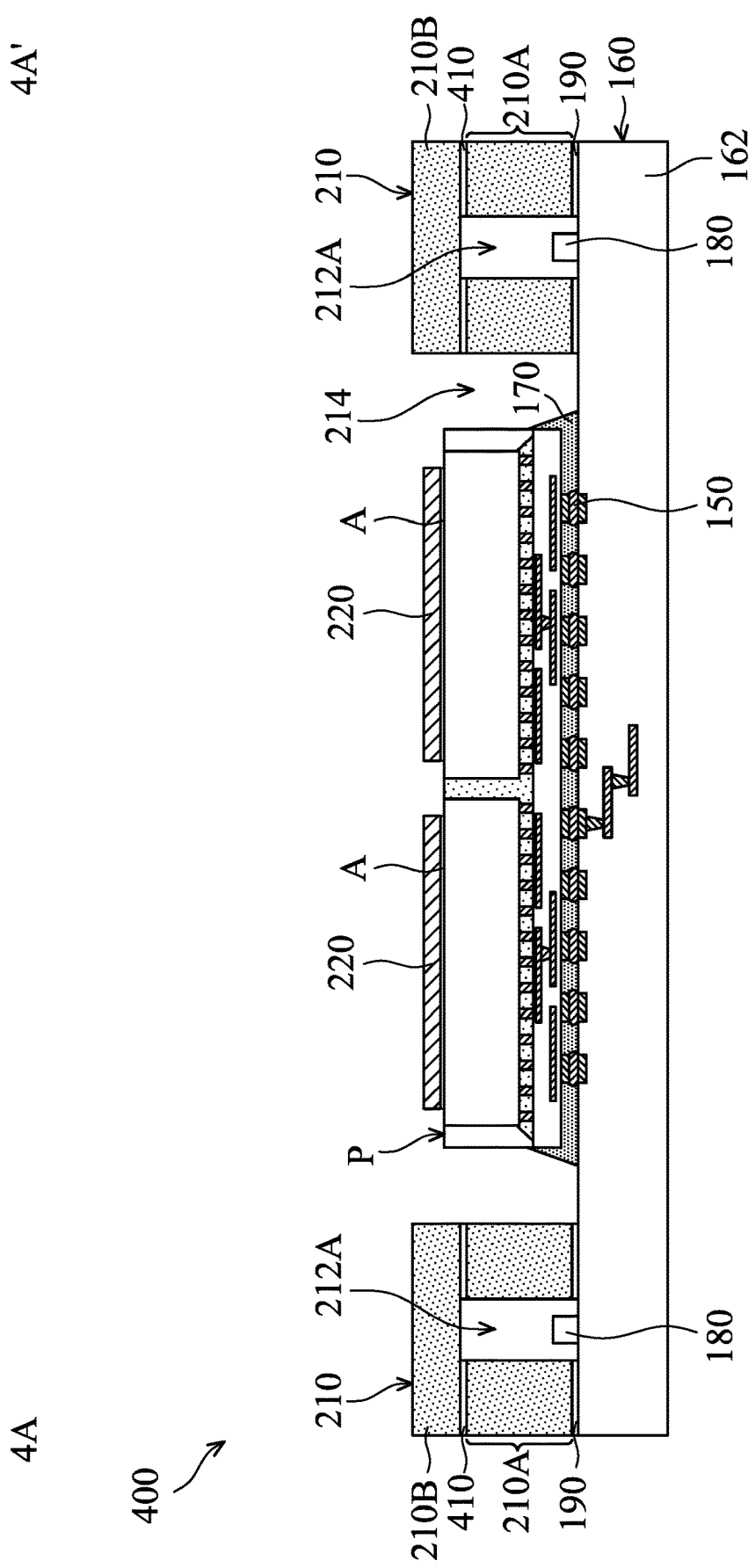
FIG. 4A is a cross-sectional view illustrating a chip package structure, in accordance with some embodiments.
Figure 4B:
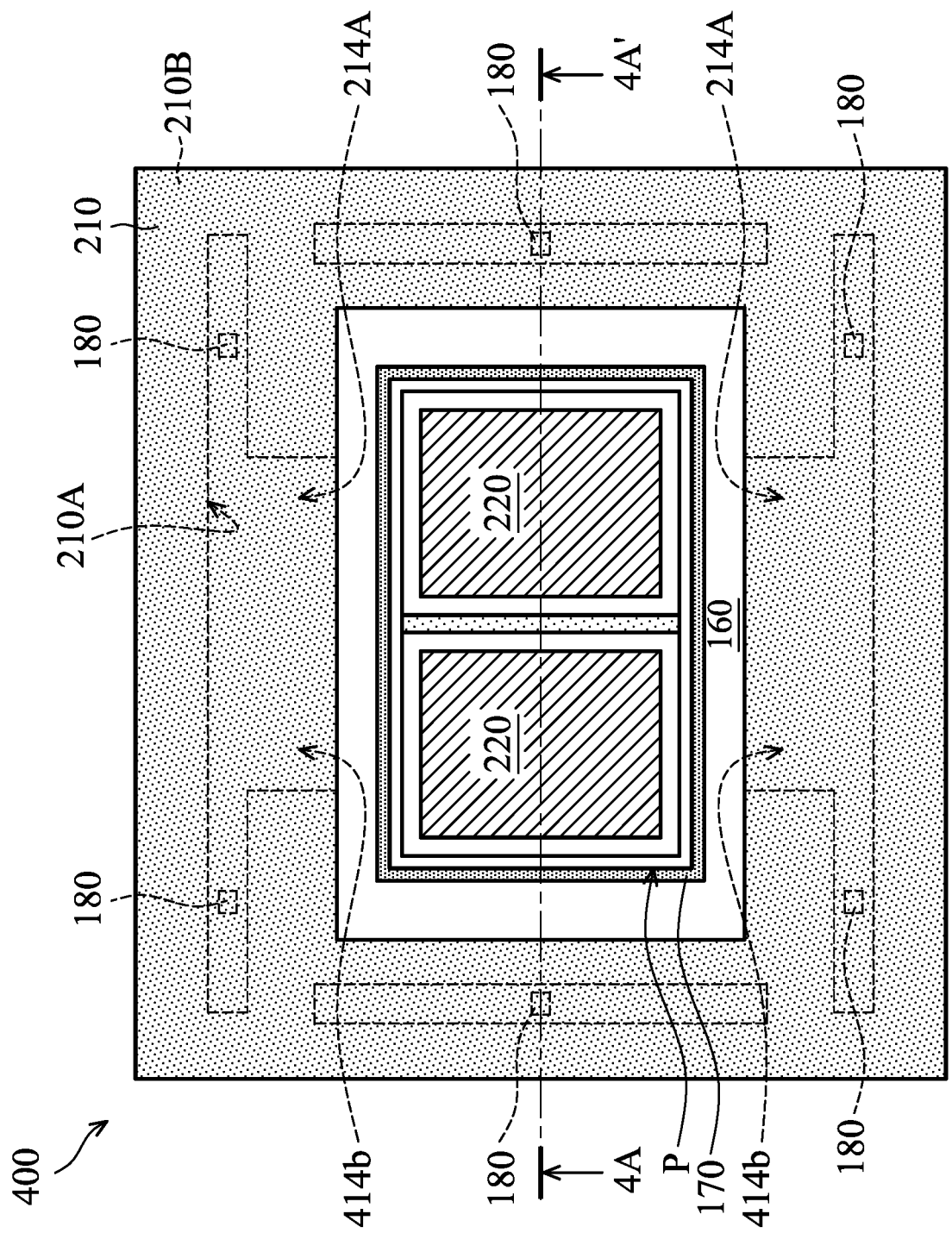
FIG. 4B is a top view illustrating the chip package structure of FIG. 4A, in accordance with some embodiments.

FIG. 4A is a cross-sectional view illustrating a chip package structure 400, in accordance with some embodiments. FIG. 4B is a top view illustrating the chip package structure 400 of FIG. 4A, in accordance with some embodiments.

Figure 4C:
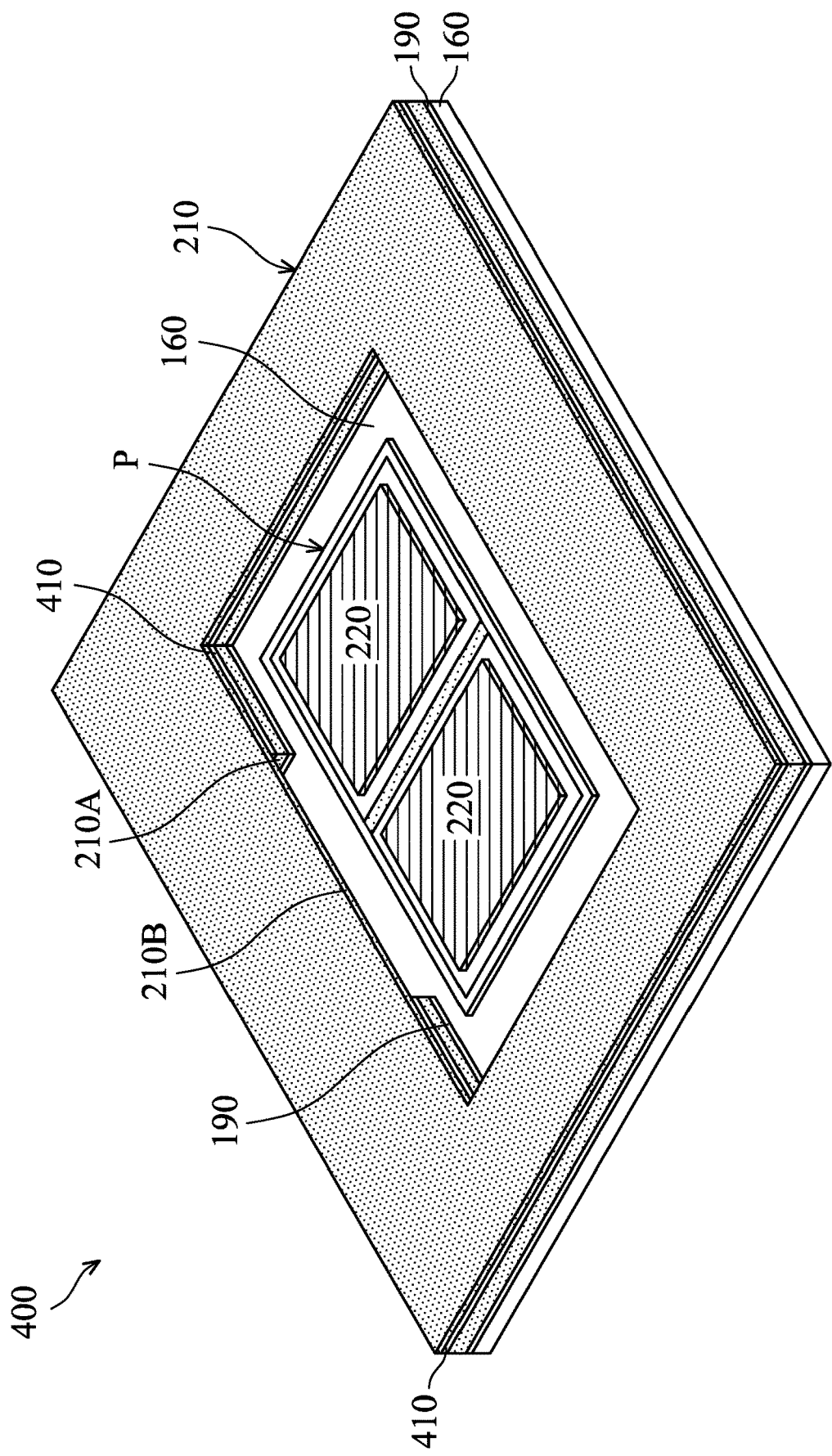
FIG. 4C is a perspective view of the chip package structure of FIG. 4A, in accordance with some embodiments.
Figure 4D:
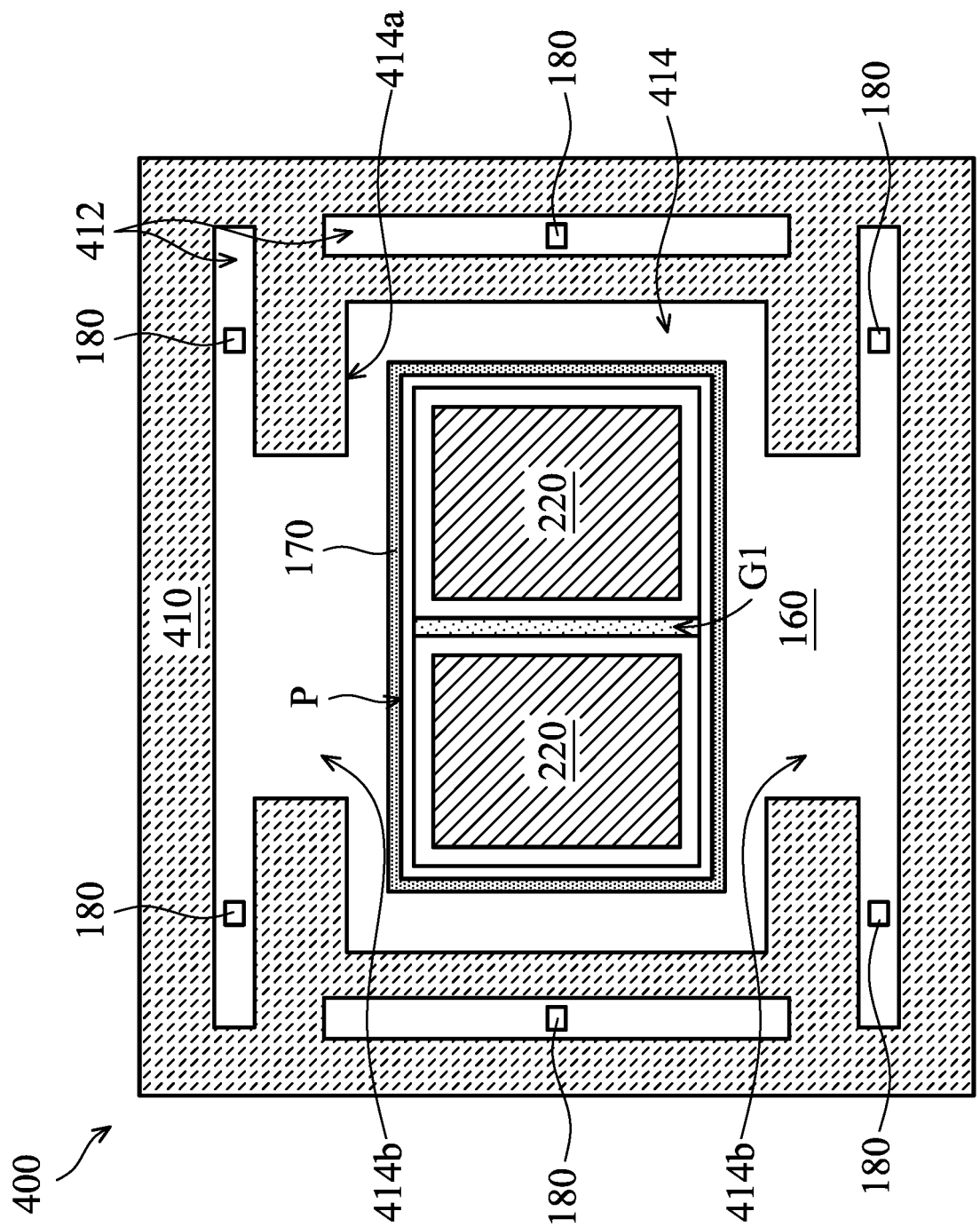
FIG. 4D is a top view illustrating the chip package structure of FIG. 4A without the ring structure, in accordance with some embodiments.
Figure 4E:
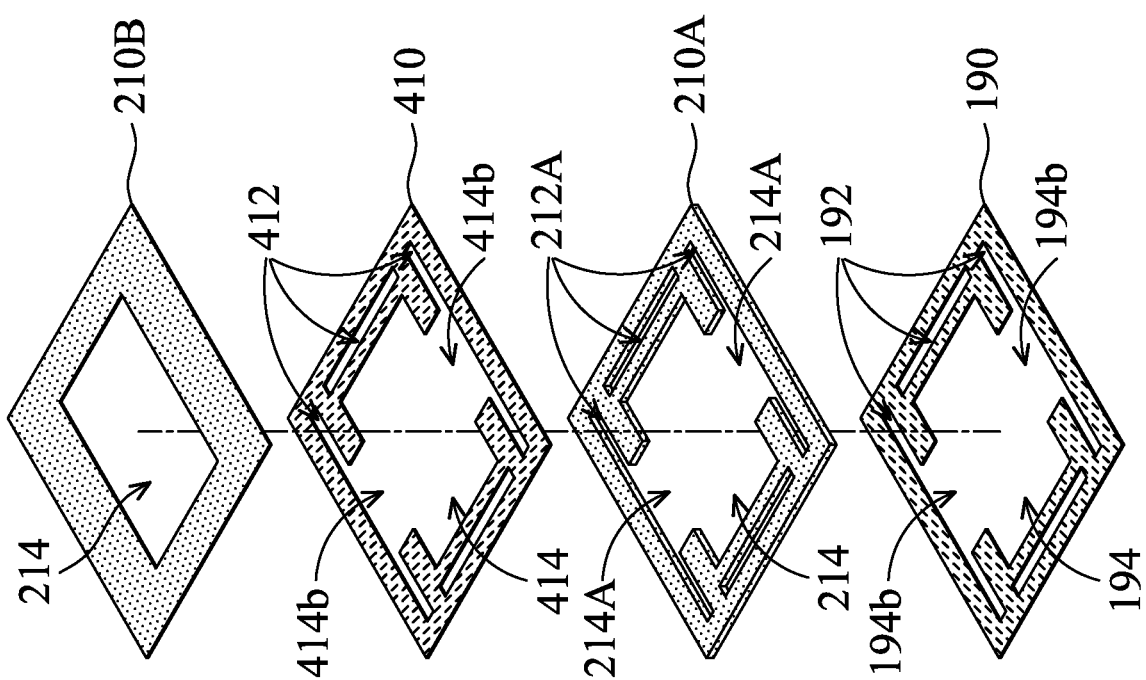
FIG. 4E is an exploded view of the ring structure and the adhesive layer of FIG. 4A, in accordance with some embodiments.

FIG. 4C is a perspective view of the chip package structure 400 of FIG. 4A, in accordance with some embodiments. For the sake of simplicity, FIG. 4C omits the underfill layer 170 and the adhesive layer A. FIG. 4D is a top view illustrating the chip package structure 400 of FIG. 4A without the ring structure 210, in accordance with some embodiments. FIG. 4E is an exploded view of the ring structure 210 and the adhesive layer 190 of FIG. 4A, in accordance with some embodiments.

As shown in FIGS. 4A, 4B and 4C, the chip package structure 400 is similar to the chip package structure 200 of FIGS. 2A, 2B and 2C, except that the ring structure 210 of the chip package structure 400 further has an adhesive layer 410 between the lower portion 210A and the upper portion 210B, in accordance with some embodiments.

As shown in FIGS. 4D and 4E, the adhesive layer 410 has trenches 412 and an opening 414, in accordance with some embodiments. The devices 180 are in the trenches 412, in accordance with some embodiments. The trenches 412 surround the opening 414, in accordance with some embodiments. The opening 414 has an inner wall 414a, in accordance with some embodiments.

The inner wall 414a has recesses 414b, in accordance with some embodiments. Each recess 414b communicates with the corresponding trench 412, in accordance with some embodiments. The gap G1 extends toward the recesses 414b, in accordance with some embodiments. The adhesive layer 410 is made of a polymer material such as epoxy or silicone, in accordance with some embodiments.

Figure 5:
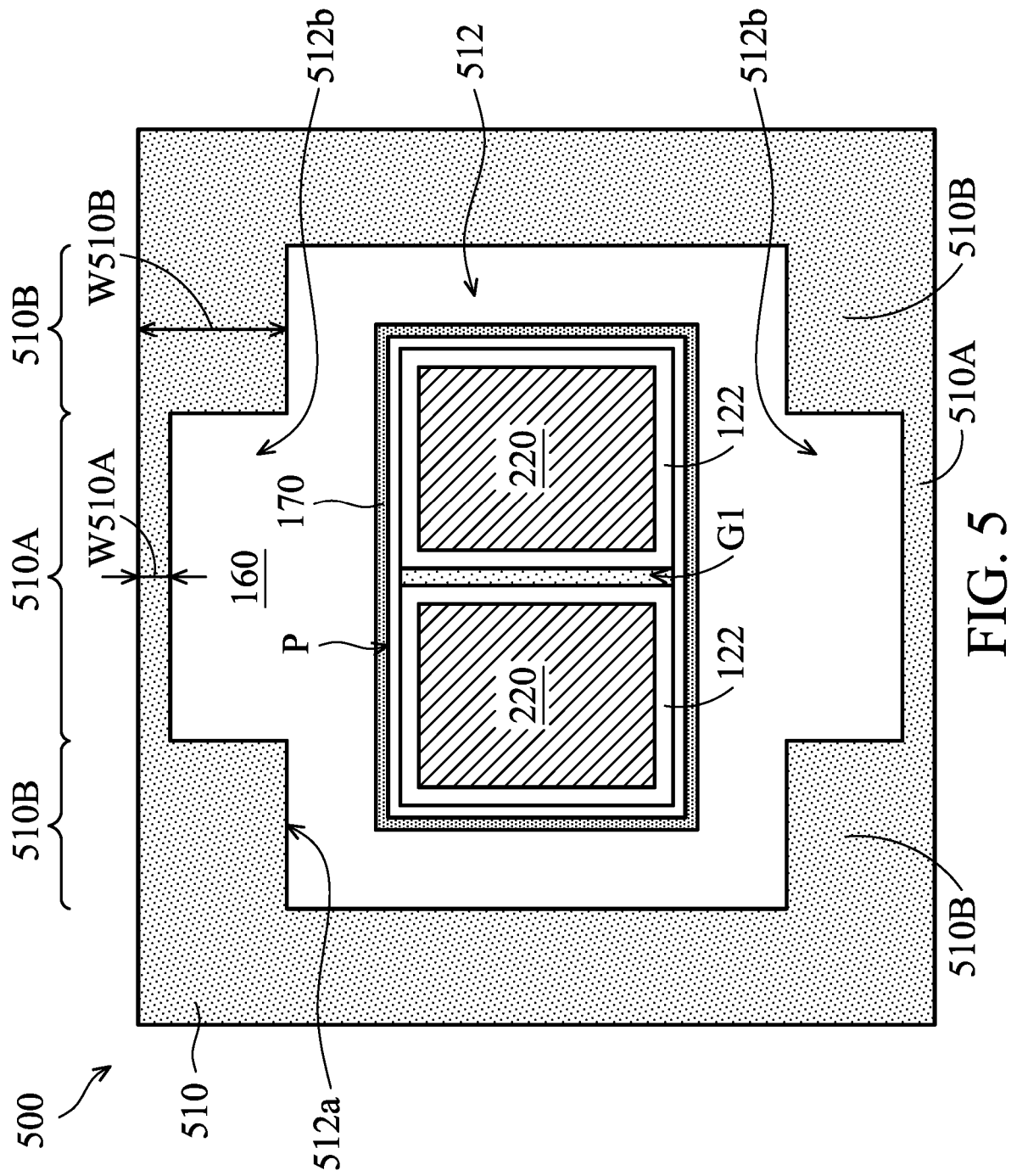
FIG. 5 is a top view illustrating a chip package structure, in accordance with some embodiments.

FIG. 5 is a top view illustrating a chip package structure, in accordance with some embodiments. As shown in FIG. 5, the chip package structure 500 is similar to the chip package structure 100 of FIG. 1E-1, except that the ring structure 510 of the chip package structure 500 does not have trenches 212 of the chip package structure 100 of FIG. 1E-1, in accordance with some embodiments.

The ring structure 510 has an opening 512, in accordance with some embodiments. The opening 512 has an inner wall 512a, in accordance with some embodiments. The inner wall 512a has recesses 512b, in accordance with some embodiments. The recesses 512b are opposite to each other, in accordance with some embodiments. The gap G1 between the chip structures 122 extends toward the recesses 512b, in accordance with some embodiments.

The ring structure 510 has narrow portions 510A and wide portions 510B, in accordance with some embodiments. The linewidth W510A of the narrow portion 510A is less than the linewidth W510B of the wide portion 510B, in accordance with some embodiments. The gap G1 between the chip structures 122 extends toward the narrow portions 510A, in accordance with some embodiments.

Figure 6:
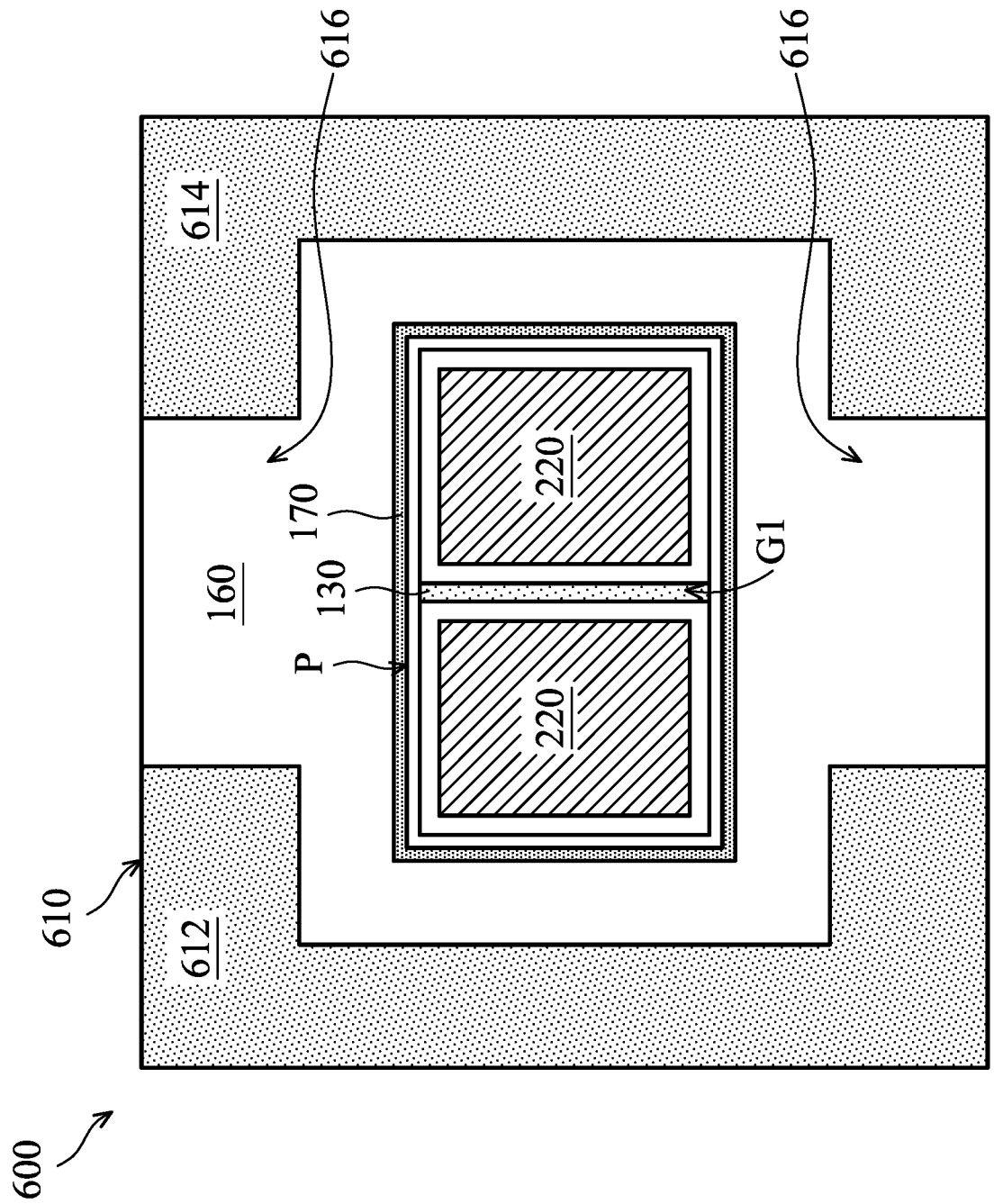
FIG. 6 is a top view illustrating a chip package structure, in accordance with some embodiments.

FIG. 6 is a top view illustrating a chip package structure 600, in accordance with some embodiments. As shown in FIG. 6, the chip package structure 600 is similar to the chip package structure 500 of FIG. 5, except that the ring structure 610 of the chip package structure 600 are divided into portions 612 and 614 by gaps 616, in accordance with some embodiments. The portions 612 and 614 are spaced apart from each other, in accordance with some embodiments. The gap G1 extends toward the gaps 616, in accordance with some embodiments.

Figure 7:
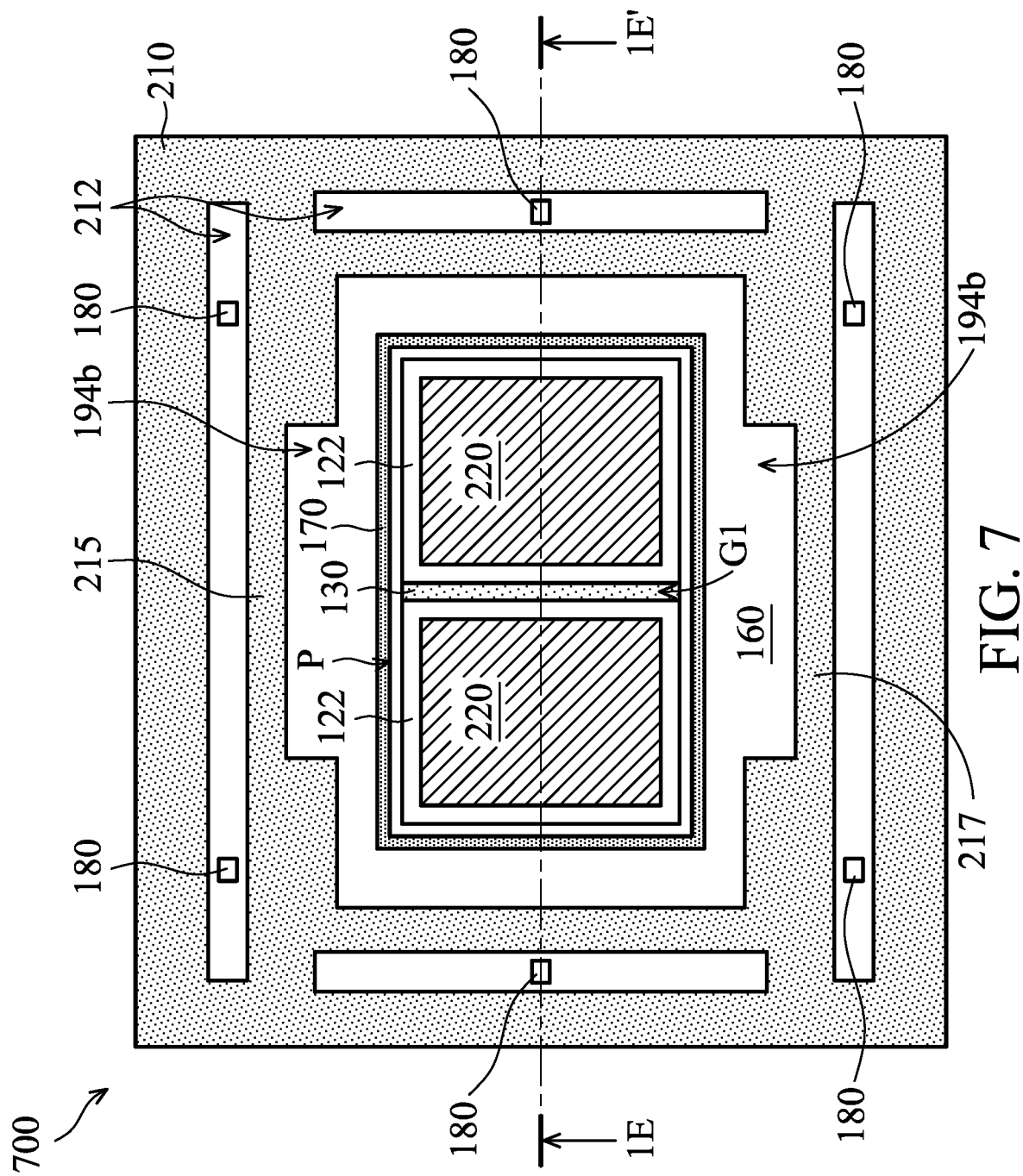
FIG. 7 is a top view illustrating a chip package structure, in accordance with some embodiments.

FIG. 7 is a top view illustrating a chip package structure 700, in accordance with some embodiments. As shown in FIG. 7, the chip package structure 700 is similar to the chip package structure 100 of FIG. 1E-1, except that the recesses 194b do not pass through the strip portions 215 and 217, in accordance with some embodiments.

Figure 8:
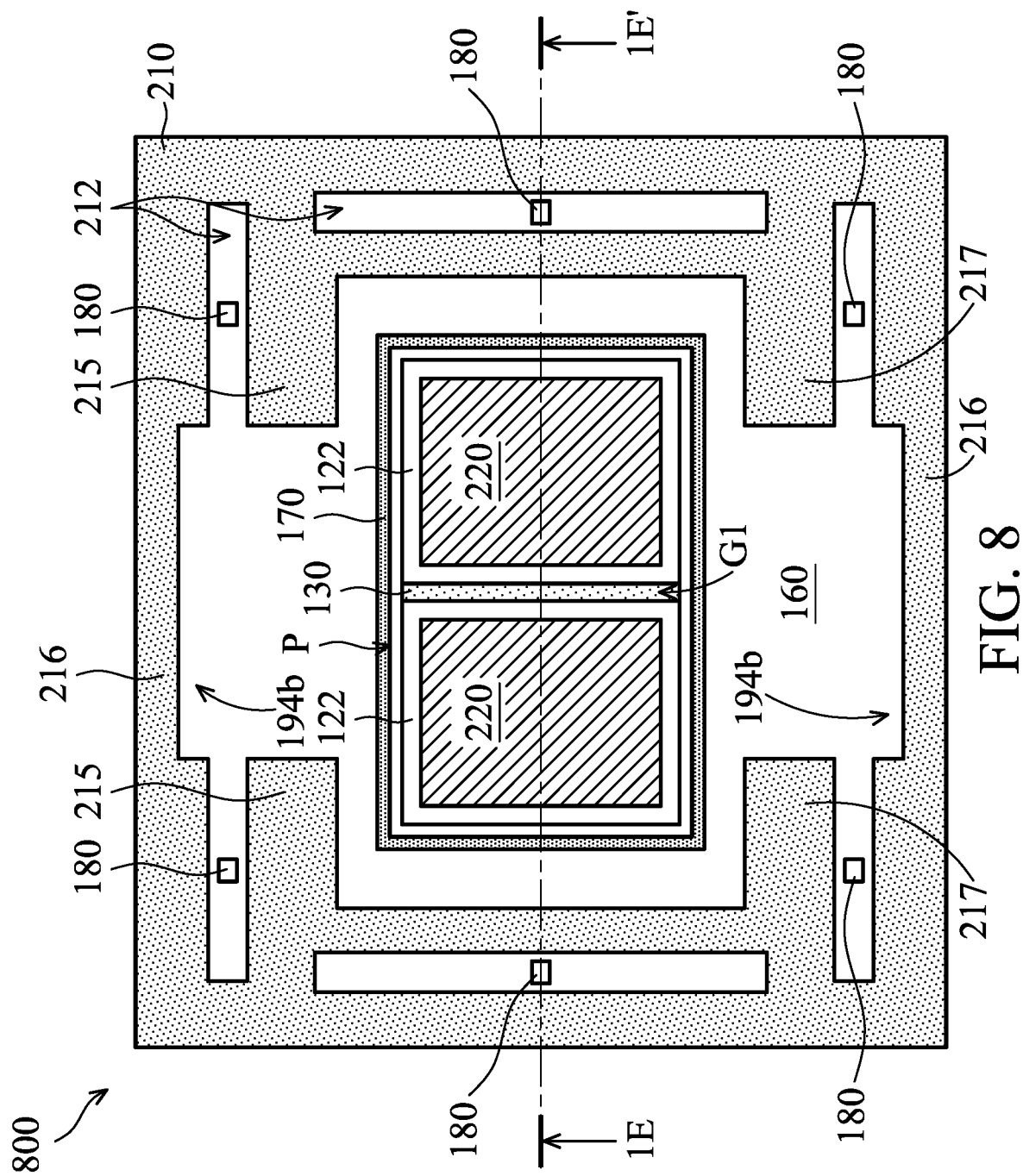
FIG. 8 is a top view illustrating a chip package structure, in accordance with some embodiments.

FIG. 8 is a top view illustrating a chip package structure 800, in accordance with some embodiments. As shown in FIG. 8, the chip package structure 800 is similar to the chip package structure 100 of FIG. 1E-1, except that the recesses 194b further extend into the outer ring 216, in accordance with some embodiments.

Processes and materials for forming the chip package structures 200, 300, 400, 500, 600, 700 and 800 may be similar to, or the same as, those for forming the chip package structure 100 described above.

In accordance with some embodiments, chip package structures and methods for forming the same are provided. The methods (for forming the chip package structure) remove a portion of an anti-warpage ring structure closed to a gap between chip structures to reduce the anti-warpage ability of the ring structure closed to the gap. As a result, the stress concentrated at an underfill layer in the gap is reduced. Since the method only removes a portion of the ring structure closed to the gap, the anti-warpage ability of the entire ring structure is substantially maintained within an acceptable range. Therefore, the yield of the chip package structure is improved.

The methods dispose lids over chip structures to reduce the warpage of the chip structures, which reduces the warpage of a wiring substrate carrying the chip structures. Therefore, the yield of the chip package structure is improved.

In accordance with some embodiments, a chip package structure is provided. The chip package structure includes a wiring substrate. The chip package structure includes a first chip structure and a second chip structure over the wiring substrate. The first chip structure is spaced apart from the second chip structure by a gap. The chip package structure includes a ring structure over the wiring substrate. The ring structure has a first opening, the first chip structure and the second chip structure are in the first opening, the first opening has a first inner wall, the first inner wall has a first recess, and the gap extends toward the first recess.

In accordance with some embodiments, a method for forming a chip package structure is provided. The method includes a wiring substrate. The method includes a first chip structure and a second chip structure over the wiring substrate. The first chip structure is spaced apart from the second chip structure by a gap. The method includes a ring structure over the wiring substrate. The ring structure surrounds the first chip structure and the second chip structure, the ring structure includes a first thin portion and a first thick portion connected with each other, and the gap extends toward the first thin portion.

In accordance with some embodiments, a method for forming a chip package structure is provided. The method includes a wiring substrate. The method includes a first chip structure and a second chip structure over the wiring substrate. The first chip structure is spaced apart from the second chip structure by a gap. The method includes a ring structure over the wiring substrate. The ring structure surrounds the first chip structure and the second chip structure, a bottom surface of the ring structure has a first recess, and the gap extends toward the first recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A chip package structure, comprising:
a wiring substrate;
a first chip structure and a second chip structure over the wiring substrate, wherein the first chip structure is spaced apart from the second chip structure by a gap; and
a ring structure over the wiring substrate, wherein the ring structure has a first opening, the first chip structure and the second chip structure are in the first opening, the first opening has a first inner wall, the first inner wall has a first recess, and the gap extends toward the first recess.

2. The chip package structure as claimed in claim 1, wherein the ring structure has an outer ring and a first strip portion surrounded by the outer ring, the first strip portion has a first end and a second end connected to the outer ring, and the first recess is in the first strip portion.

3. The chip package structure as claimed in claim 2, wherein the first recess passes through the first strip portion.

4. The chip package structure as claimed in claim 1, wherein the ring structure has an upper portion and a lower portion, and the first recess is in the lower portion.

5. The chip package structure as claimed in claim 4, wherein the ring structure further comprises:
an adhesive layer between the upper portion and the lower portion.

6. The chip package structure as claimed in claim 1, further comprising:
a redistribution structure over the wiring substrate, wherein the first chip structure and the second chip structure are over the redistribution structure; and
an underfill layer over the redistribution structure, wherein the underfill layer is in the gap and between the first chip structure and the redistribution structure and between the second chip structure and the redistribution structure.

7. The chip package structure as claimed in claim 6, wherein a first top surface of the underfill layer is substantially level with a second top surface of the first chip structure.

8. The chip package structure as claimed in claim 1, wherein the inner wall of the opening of the ring structure further has a second recess, and the gap is between the first recess and the second recess.

9. The chip package structure as claimed in claim 1, further comprising:
an adhesive layer between the wiring substrate and the ring structure.

10. The chip package structure as claimed in claim 9, wherein the adhesive layer has a second opening under the first opening, the second opening has a second inner wall, and the second inner wall has a second recess under the first recess.

11. A chip package structure, comprising:
a wiring substrate;
a first chip structure and a second chip structure over the wiring substrate, wherein the first chip structure is spaced apart from the second chip structure by a gap; and
a ring structure over the wiring substrate, wherein the ring structure surrounds the first chip structure and the second chip structure, the ring structure comprises a first thin portion and a first thick portion connected with each other, and the gap extends toward the first thin portion.

12. The chip package structure as claimed in claim 11, wherein the ring structure comprises a second thin portion and a second thick portion, the first thin portion is between and connected to the first thick portion and the second thick portion, and the second thin portion is between and connected to the first thick portion and the second thick portion.

13. The chip package structure as claimed in claim 12, wherein the gap is between the first thin portion and the second thin portion.

14. The chip package structure as claimed in claim 12, wherein the first thin portion is opposite to the second thin portion.

15. The chip package structure as claimed in claim 12, wherein a first top surface of the first thin portion and a second top surface of the second thin portion are substantially level with each other.

16. A chip package structure, comprising:
a wiring substrate;
a first chip structure and a second chip structure over the wiring substrate, wherein the first chip structure is spaced apart from the second chip structure by a gap; and
a ring structure over the wiring substrate, wherein the ring structure surrounds the first chip structure and the second chip structure, a bottom surface of the ring structure has a first recess, and the gap extends toward the first recess.

17. The chip package structure as claimed in claim 16, wherein the bottom surface of the ring structure further has a second recess, and the gap is between the first recess and the second recess.

18. The chip package structure as claimed in claim 16, wherein the first recess does not pass through the ring structure.

19. The chip package structure as claimed in claim 16, wherein the first recess has a T-like shape.

20. The chip package structure as claimed in claim 16, further comprising:
a lid over the first chip structure.

* * * * *